(12) United States Patent
Kobayashi

(10) Patent No.: US 7,057,438 B2
(45) Date of Patent: Jun. 6, 2006

(54) OUTPUT CIRCUIT AND SEMICONDUCTOR INTEGRATED CIRCUIT INCORPORATING IT THEREIN

(75) Inventor: Shinichiro Kobayashi, Hino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/859,450

(22) Filed: Jun. 2, 2004

(65) Prior Publication Data

US 2005/0007174 A1    Jan. 13, 2005

(30) Foreign Application Priority Data

| Jun. 3, 2003 | (JP) | ............................. 2003-158252 |
| Jan. 20, 2004 | (JP) | ............................. 2004-011396 |

(51) Int. Cl.
*G06F 1/04* (2006.01)

(52) U.S. Cl. ......................................... 327/296; 327/65

(58) Field of Classification Search .................. 327/65, 327/73, 112, 296, 298, 309, 436, 437
See application file for complete search history.

(56) References Cited

U.S. PATENT DOCUMENTS

| 5,115,151 | A | * | 5/1992 | Hull et al. ..................... 327/65 |
| 5,608,796 | A | * | 3/1997 | Banu et al. .................. 379/403 |
| 5,661,395 | A | * | 8/1997 | Johnson et al. ............. 323/273 |
| 5,751,186 | A | * | 5/1998 | Nakao ........................ 327/562 |
| 5,929,668 | A | * | 7/1999 | Kim ........................... 327/112 |
| 6,194,920 | B1 | * | 2/2001 | Oguri ......................... 327/65 |
| 6,617,897 | B1 | * | 9/2003 | Lee ............................ 327/170 |
| 6,677,799 | B1 | * | 1/2004 | Brewer ....................... 327/344 |
| 6,784,702 | B1 | * | 8/2004 | Chen .......................... 327/110 |
| 6,836,144 | B1 | * | 12/2004 | Bui et al. ..................... 326/32 |
| 2002/0021161 | A1 | * | 2/2002 | Murayama et al. ......... 327/324 |
| 2002/0021602 | A1 | * | 2/2002 | Morishita ................... 365/201 |
| 2002/0079944 | A1 | * | 6/2002 | Sander ....................... 327/309 |
| 2004/0061534 | A1 | * | 4/2004 | Yamamoto .................. 327/112 |

FOREIGN PATENT DOCUMENTS

| JP | 02-001615 | 1/1990 |
| JP | 06-314965 | 11/1994 |
| JP | 06-326591 | 11/1994 |
| JP | 08-307236 | 11/1996 |
| JP | 2000-031810 | 1/2000 |
| JP | 2002-353792 | 12/2002 |
| JP | 2003-087110 | 3/2003 |
| JP | 2004-140487 | 5/2004 |
| WO | WO 91/20130 | 12/1991 |

* cited by examiner

*Primary Examiner*—Terry D. Cunningham
*Assistant Examiner*—Thomas J. Hiltunen
(74) *Attorney, Agent, or Firm*—Harness, Dickey & Pierce, P.L.C.

(57) ABSTRACT

An output circuit is provided for outputting, based on a first drive signal, an output signal with an amplitude smaller than a source voltage, comprising: a first type MOS transistor whose gate is impressed with a first drive signal and whose drain outputs a signal; a second type MOS transistor whose gate is impressed with a second drive signal and whose drain outputs a signal; and feedback circuits generating the second drive signal by feeding an output signal obtained by synthesizing the signal outputted by the first type MOS transistor and the signal outputted by the second type MOS transistor back to the gate of the second type MOS transistor.

8 Claims, 15 Drawing Sheets

OUTPUT CIRCUIT AND SEMICONDUCTOR INTEGRATED CIRCUIT INCORPORATING IT THEREIN

RELATED APPLICATIONS

This applications claims priority to Japanese Patent Application Nos. 2003-158252 filed Jun. 3, 2003 and 2004-011396 filed Jan. 20, 2004 which are hereby expressly incorporated by reference herein in their entirety.

BACKGROUND

1. Field of the Invention

This invention relates to an output circuit for outputting a signal to an external circuit, and more particularly to a semiconductor integrated circuit with such an output circuit built-in.

2. Related Art

Interface signals are available at very high speed in recent years, and measures to cope with interface signal noise and EMI (electromagnetic interference) have been needed. As a countermeasure for such noise and EMI, there is implemented a measure to reduce an amplitude of an interface signal. However, as described in Japanese Published Patent No. Hei-6-326591 (Page 1, FIG. 1), when the amplitude of a signal is lowered by reducing a source voltage supplied to an output circuit, a power circuit becomes complicated. Further, there is a risk that reference levels of signals between a circuit of a high source voltage type and a circuit of a low source voltage type may not be in agreement.

Furthermore, there is a case where a differential signal is used as an interface signal. FIG. 18 is a diagram showing an example of a prior art differential signal output circuit. A differential signal output circuit 81 shown in FIG. 18 is a circuit for outputting, based on one input signal J1, a pair of differential signals of a first output signal J4 and a second output signal J4 bar. However, in the differential signal output circuit 81, a drive signal J3 is delayed from a drive signal J2 by a delay time of an inverter INV 82, hence, the first output signal J4 and the second output signal J4 bar have skewing.

A differential signal output circuit capable of reducing the skewing mentioned above is also used. FIG. 19 is a diagram showing another example of a conventional differential signal output circuit. A differential signal output circuit 91 shown in FIG. 19 is a circuit for outputting, based on one input signal K1, a pair of differential signals of a first output signal K4 and a second output signal K4 bar. The interface signal output circuit 91 is, by comparison to the interface signal output circuit 81 (refer to FIG. 1), further constituted by a capacitor C91, and by this capacitor C91, a drive signal K2 is delayed to reduce skewing of drive signals K2 and K3, thereby decreasing skewing of the first output signal K4 and the second output signal K4 bar.

Nevertheless, in the interface signal output circuit 91, due to a scattering of a manufacturing process, an electrostatic capacity required to reduce the skewing of the first output signal K4 and the second output signal K4 bar may not be in agreement with an electrostatic capacity of the capacitor C91. As a result, there were cases where yield dropped or a product defect occurred at a client's side. Also, it was necessary to be stringent about allowing margins of a source potential fluctuation and a temperature fluctuation, sometimes leading to a yield drop.

In view of the above-mentioned considerations, it is a first object of this invention to make high-speed operation possible through a simple circuit configuration in an output circuit for outputting signals of a small amplitude. Further, it is a second object of this invention to prevent a yield drop and the like in a differential signal output circuit for outputting a pair of differential signals. Still further, it is a third object of this invention to provide a semiconductor integrated circuit having such an output circuit built-in.

SUMMARY

To solve the above-mentioned problems, an output circuit according to a first aspect of this invention is an output circuit for outputting, based on a first drive signal, an output signal of an amplitude smaller than a source voltage, comprising: a first MOS transistor of a first type which outputs a signal from its drain as a first drive signal is impressed on its gate; a second MOS transistor of a second type which outputs a signal from its drain as a second drive signal is impressed on its gate; and a feedback circuit generating a second drive signal by feeding an output signal obtained by synthesizing the signal outputted by the first MOS transistor and the signal outputted by the second MOS transistor back to the gate of the second MOS transistor.

At this point, the feedback circuit may be adapted to include a passive element connected to a first terminal at a node of the drain of the first MOS transistor and the drain of the second MOS transistor as well as a buffer circuit buffering a signal supplied from a second terminal of the passive element.

The output circuit according to a second aspect of this invention is an output circuit for outputting, based on the first drive signal, an output signal having an amplitude smaller than the source voltage, comprising the first MOS transistor of the first type which outputs a signal from its drain as the first drive signal is impressed on its gate; the second MOS transistor of the second type which outputs a signal from its drain as the second drive signal is impressed on its gate; and the feedback circuit generating the second drive signal by inverting an output signal obtained by synthesizing the signal outputted by the first MOS transistor and the signal outputted by the second MOS transistor and feeding the signal back to the gate of the second MOS transistor.

At this point, the feedback circuit may be adapted to include a passive element connected to the first terminal at the node of the drain of the first MOS transistor and a source of the second MOS transistor and an inverter inverting a signal supplied from the second terminal of the passive element.

The output circuit according to a third aspect of this invention is an output circuit for outputting, based on the first and the second drive signal constituting the pair of differential signals, the first and the second output signal, having an amplitude smaller than the source voltage and constituting the pair of differential signals, comprising: the first MOS transistor of the first type which outputs a signal from its drain as the first drive signal is impressed on its gate; the second MOS transistor of the second type which outputs a signal from its drain as a third drive signal is impressed on its gate; a first feedback circuit generating the third drive signal by inverting the first output signal obtained by synthesizing the signal outputted by the first MOS transistor and the signal outputted by the second MOS transistor and feeding the signal back to the gate of the second MOS transistor; a third MOS transistor of the first type which outputs a signal from its drain as the second drive signal is impressed on its gate; a fourth MOS transistor of the second type which outputs a signal from its drain as a fourth drive signal is impressed on its gate; and a second feedback circuit generating the fourth drive signal by feeding the second output signal obtained by synthesizing the signal outputted by the third MOS transistor and the signal outputted by the fourth MOS transistor back to the gate of the second MOS transistor.

The output circuit according to a fourth aspect of this invention is an output circuit for outputting, based on the first and the second drive signal constituting the pair of differential signals, the first and the second output signal having an amplitude smaller than the source voltage and constituting the pair of differential signals, comprising: the first MOS transistor of the first type which outputs a signal from its drain as the first drive signal is impressed on its gate; the second MOS transistor of the first type which outputs a signal from its drain as the third drive signal is impressed on its gate; the first feedback circuit generating the third drive signal by inverting the first output signal obtained by synthesizing the signal outputted by the first MOS transistor and the signal outputted by the second MOS transistor and feeding the signal back to the gate of the second MOS transistor; the third MOS transistor of the first type which outputs a signal from its drain as the second drive signal is impressed on its gate; the fourth MOS transistor of the first type which outputs a signal from its drain as the fourth drive signal is impressed on its gate; and the second feedback circuit generating the fourth drive signal by inverting the second output signal obtained by synthesizing the signal outputted by the third MOS transistor and the signal outputted by the fourth MOS transistor and feeding the signal back to the gate of the fourth MOS transistor.

The output circuit according to the third or the fourth aspect of this invention may be adapted to further include a first inverting circuit inverting an input signal and outputting the first drive signal and the second inverting circuit inverting the first drive signal and outputting the second drive signal.

The output circuit according to a fifth aspect of this invention is a circuit for outputting, based on the first and the second drive signal constituting the pair of differential signals, the first and the second output signal constituting the pair of differential signals, comprising: a first and a second signal level conversion circuit respectively converting the first and the second drive signal to a signal of a prescribed level and outputting the signal; a first differential circuit for outputting a signal corresponding to a difference between a signal outputted by the first signal level conversion circuit and a signal outputted by the second signal level conversion circuit; a second differential circuit for outputting a signal corresponding to a difference between a signal outputted by the second signal level conversion circuit and a signal outputted by the first signal level conversion circuit; a first output signal generating circuit generating a first output signal based on a signal outputted by the first differential circuit; and a second output signal generating circuit generating a second output signal based on a signal outputted by the second differential circuit.

At this point, the first or the second signal level conversion circuit may be adapted to include a single-end sense amplifier, the first or the second differential circuit may be adapted to include a current mirror type differential amplifier circuit, and the first or the second output signal generating circuit may be adapted to include an inverter.

Also, the invention may be adapted to further comprise the first inverting circuit inverting an input signal and outputting the first drive signal as well as the second inverting circuit inverting the first drive signal and outputting the second drive signal.

In that case, the invention may be adapted so that the first and the second inverting circuit operate upon receipt of power supply from a first and a second source potential, and that the first and the second signal level conversion circuit, the first and the second differential circuit, and the first and the second output signal generating circuit operate upon receipt of power supply from the first and the third source potential.

Or the invention may be adapted so that the first and the second inverting circuit operate upon receipt of power supply from the first and the second source potential, that the first and the second signal level conversion circuit operate upon receipt of power supply from the first and the third source potential, and that the first and the second differential circuit and the first and the second output signal generating circuit operate upon receipt of power supply from the first and a fourth source potential.

At this time, the invention may be adapted so that the third source potential is at a higher potential than the second source potential, and that the fourth source potential is at a higher potential than the third source potential. Or it may be adapted such that the third source potential is at a lower potential than the second source potential, and that the fourth source potential is at a lower potential than the third source potential.

Furthermore, a semiconductor integrated circuit according to this invention has any of the above-mentioned signal output circuits built-in.

According to the first to the fourth aspect of this invention, in an output circuit for outputting a signal of a small amplitude, through application of a negative feedback by using a feedback circuit, it is possible to achieve high-speed operation in terms of a simple circuit configuration. Further, according to the fifth aspect of this invention, in a differential signal output circuit for outputting a pair of differential signals, it is possible to prevent a yield drop and the like. Still further, in the pair of differential signals which are obtained according to the fifth aspect of this invention, even if fluctuations of a source voltage, operating temperature and process should occur, it is possible to maintain its eye pattern shape.

DETAILED DESCRIPTION

Figure 1:
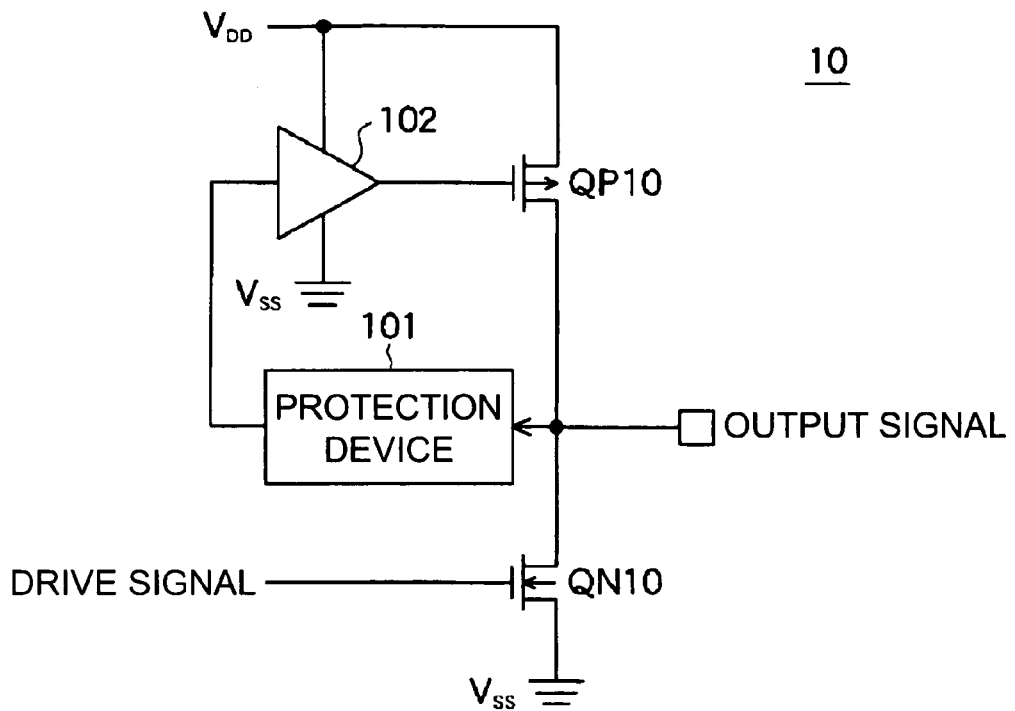
FIG. 1 is a diagram showing a configuration of an output circuit according to a first embodiment of this invention.

Preferred embodiments according to this invention will be described in detail below with reference to drawings, wherein like reference numerals designate identical or corresponding parts throughout to omit duplicate explanation.

FIG. 1 is a diagram showing a configuration of an output circuit according to a first embodiment of this invention. An output circuit 10 includes an n-channel transistor QN10 to which a drive signal is supplied, a p-channel transistor QP10 serially connected to the transistor QN10, an output terminal connected to drains of the transistor QP10 and the QN10 and a protection device 101, and a buffer circuit 102 to which an output signal of the output circuit 10 is supplied through the protection device 101. It is to be noted that the buffer circuit 102 consists of a 2-stage inverter connected in series.

A source of the transistor QP10 is connected to a source potential $V_{DD}$, and the source of the transistor QN10 is connected to a source potential $V_{SS}$ (to be set as a grounding potential in this embodiment). The protection device 101 is an element to protect an input of the buffer circuit 102 from static electricity impressed upon the output terminal, and, as the protection device 101, for example, a resistance is used. An output signal of the output circuit 10 is supplied to input of the buffer circuit 102 through the protection device 101, and a signal outputted by the buffer circuit 102 is supplied to a gate of the transistor QP10, whereby a self feedback circuit is formed.

Figure 2:
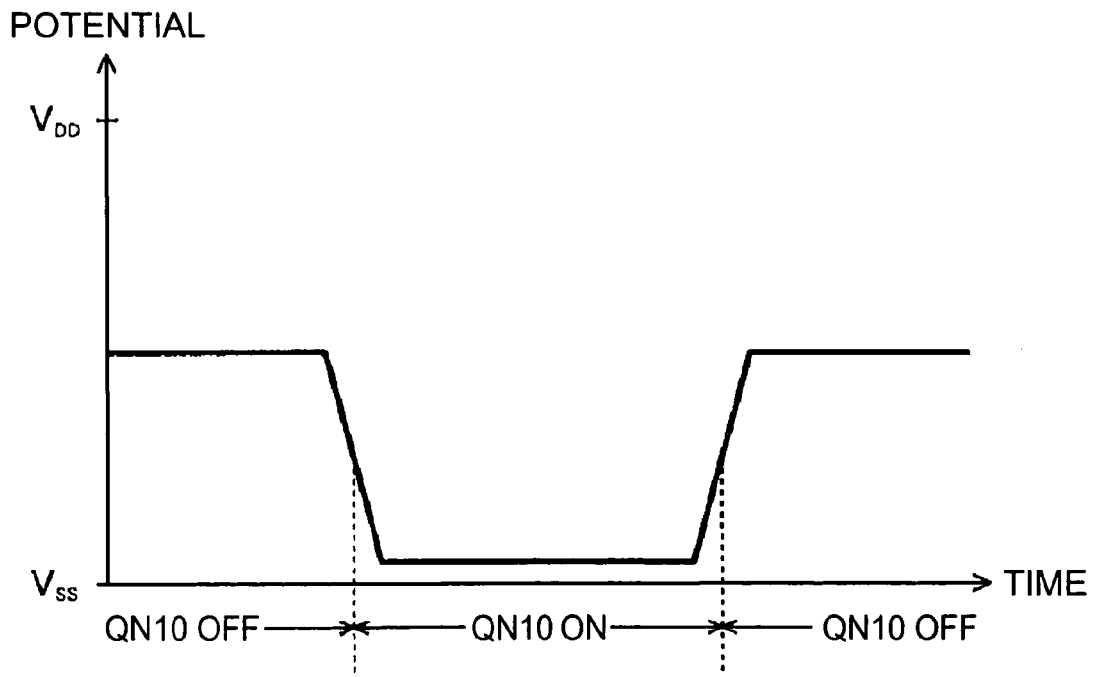
FIG. 2 is a diagram showing a waveform of the output circuit shown in FIG. 1.

FIG. 2 is a diagram showing a waveform of an output signal of an output circuit shown in FIG. 1. When a drive signal is at a low level, the transistor QN10 is in an "off" state, and a potential of the output signal is nearly $(V_{DD}-V_{SS})/2$. When the drive signal is at a high level, the transistor QN10 is in an "on" state, and the potential of the output signal decreases to near the source potential $V_{SS}$. Consequently, an amplitude of the output signal becomes a half swing which is approximately half of the source potential $(V_{DD}-V_{SS})$. Further, this output circuit is capable of performing high-speed operation by operation of self feedback.

In this embodiment, it is possible to set the high level of the drive signal as the source potential $V_{DD}$ and the low level of the drive signal as the source potential $V_{SS}$. Or, the high level of the drive signal may be set as a potential other than the source potential $V_{DD}$. In that case, the output circuit according to this embodiment will have a function as a level shifter, too. Now, the output signal of the output circuit 10 may be set to receive from an output of either of the inverters constituting the buffer circuit 102.

Next, a second embodiment of this invention will be described.

Figure 3:
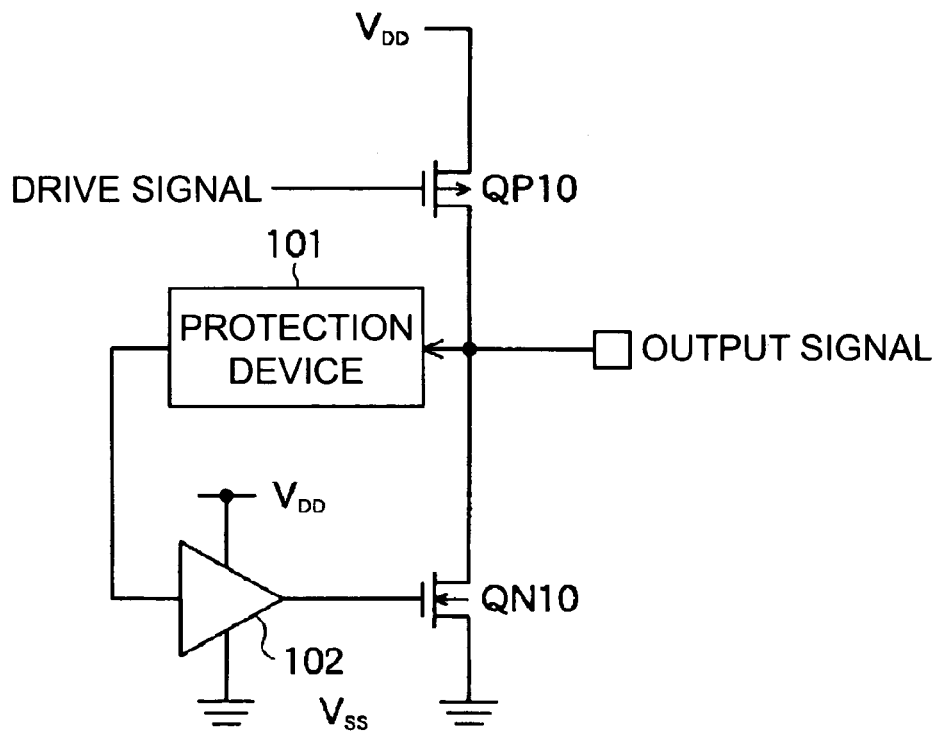
FIG. 3 is a diagram showing a configuration of an output circuit according to a second embodiment of this invention.

FIG. 3 is a diagram showing a configuration of an output circuit according to the second embodiment of this invention. The output circuit includes a p-channel transistor QN10 to a gate of which a drive signal is supplied, a n-channel transistor QP10 serially connected to the transistor QN10, an output terminal connected to drains of the transistor QP10 and the QN10 and a protection device 101, and a buffer circuit 102 to which an output signal of the output circuit 10 is supplied through the protection device 101.

A source of the transistor QP10 is connected to a source potential $V_{DD}$, and the source of the transistor QN10 is connected to a source potential $V_{SS}$ (to be set as a grounding potential in this embodiment). An output signal of the output circuit is supplied to input of the buffer circuit 102 through the protection device 101, and a signal outputted by the buffer circuit 102 is supplied to the gate of the transistor QP10, whereby a self feedback circuit is formed.

Figure 4:
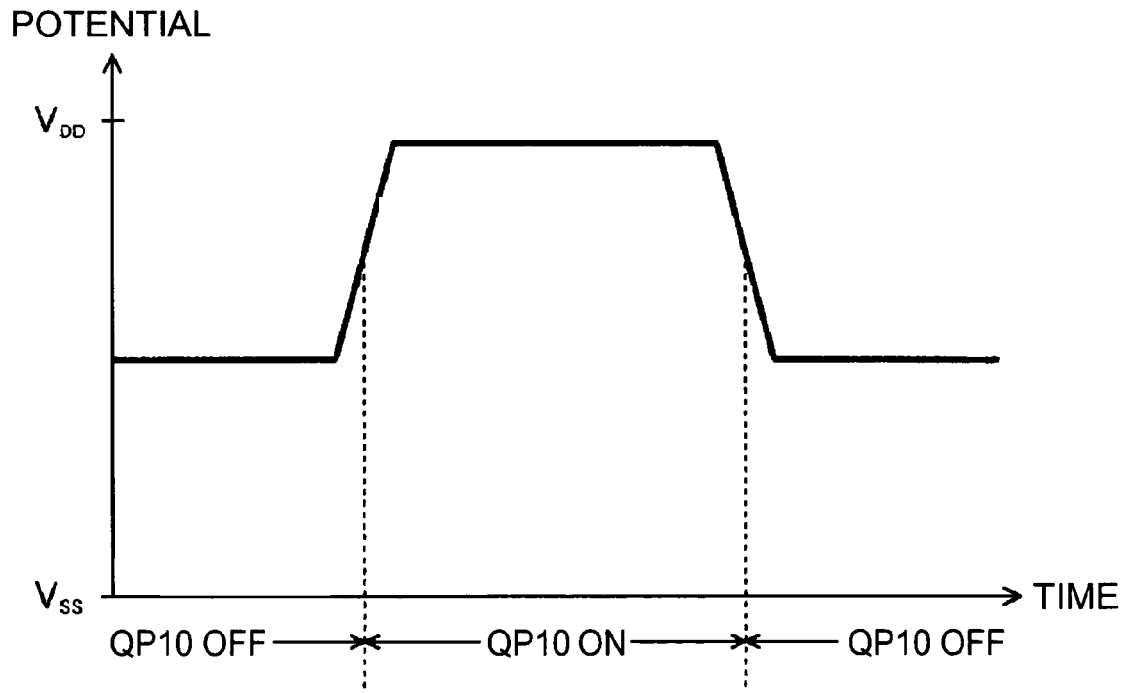
FIG. 4 is a diagram showing a waveform of the output circuit shown in FIG. 3.

FIG. 4 is a diagram showing a waveform of an output signal of an output circuit shown in FIG. 3. When a drive signal is at a high level, the transistor QN10 is in the "off" state, and a potential of the output signal is nearly $(V_{DD}-V_{SS})/2$ due to a self feedback operation. When the drive signal is at a low level, the transistor QN10 is in the "on" state, and the potential of the output signal increases to near the source potential $V_{SS}$. Consequently, an amplitude of the output signal becomes a half swing which is approximately half of the source potential $(V_{DD}-V_{SS})$. Further, this output circuit is capable of performing high-speed operation by the self feedback operation.

In this embodiment, it is possible to set the high level of the drive signal as the source potential $V_{DD}$ and the low level of the drive signal as the source potential $V_{SS}$. Or, the low level of the drive signal may be set as a potential other than the source potential $V_{SS}$. In that case, the output circuit according to this embodiment will have a function as a level shifter, too. Now, the output signal of the output circuit may be set to receive from an output of either of the inverters constituting the buffer circuit 102.

Next, a third embodiment of this invention will be described.

Figure 5:
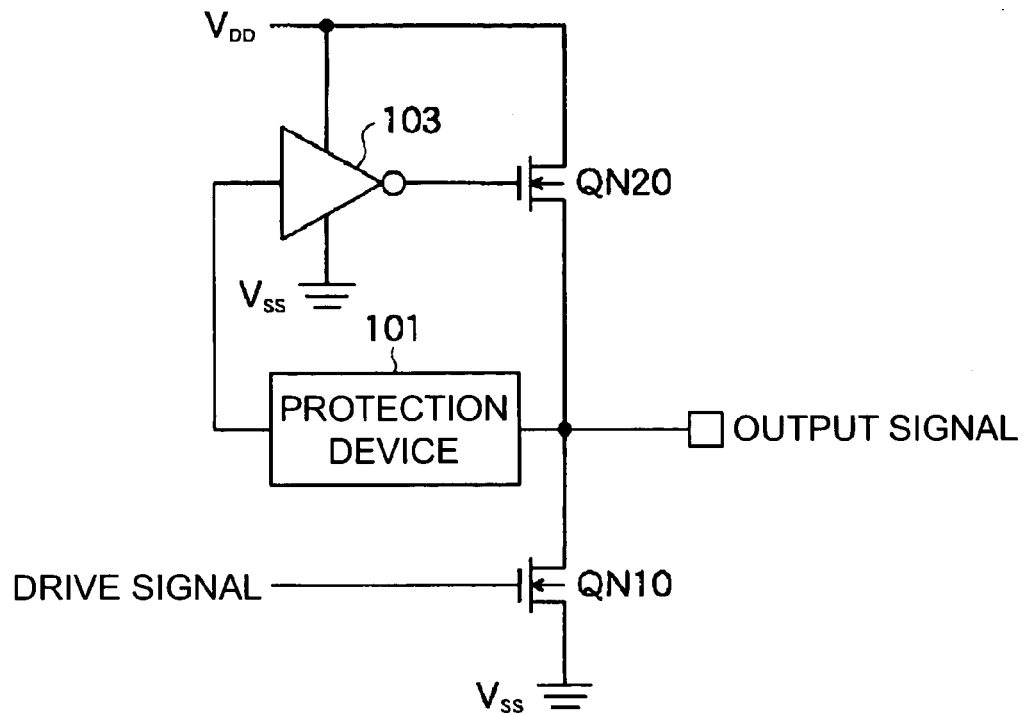
FIG. 5 is a diagram showing a configuration of an output circuit according to a third embodiment of this invention.

FIG. 5 is a diagram showing a configuration of an output circuit according to the third embodiment of this invention. The output circuit includes a n-channel transistor QN10 to a gate of which a drive signal is supplied, a n-channel transistor QN20 serially connected to the transistor QN10, an output terminal connected to drains of the transistor QP10 and the QN20 and a protection device 101, and an inverter 103 to which an output signal of the output circuit 10 is supplied through the protection device 101.

A drain of the transistor QN20 is connected to the source potential $V_{DD}$, and the source of the transistor QN10 is connected to the source potential $V_{SS}$ (to be set as a grounding potential in this embodiment). An output signal of the output circuit is supplied to input of the inverter 103 through the protection device 101, and a signal outputted by the inverter 103 is supplied to a gate of the transistor QN20, whereby a self feedback circuit is formed.

When a drive signal is at a low level, the transistor QN10 is in the "off" state, and a potential of the output signal is nearly $(V_{DD}-V_{SS})/2$ due to the self feedback operation. When the drive signal is at a high level, the transistor QN10 is in the "on" state, and the potential of the output signal decreases to near the source potential $V_{SS}$. Consequently, an amplitude of the output signal becomes a half swing which is approximately half of the source potential ($V_{DD}$-$V_{SS}$). Further, this output circuit is capable of performing high-speed operation by the self feedback operation.

In this embodiment, it is possible to set the high level of the drive signal as the source potential $V_{DD}$ and the low level of the drive signal as the source potential $V_{SS}$. Or, the high level of the drive signal may be set as a potential other than the source potential $V_{SS}$. In that case, the output circuit according to this embodiment will have a function as a level shifter, too. Now, the output signal of the output circuit may be set to receive from an output of the inverter 103.

Next, a fourth embodiment of this invention will be described.

Figure 6:
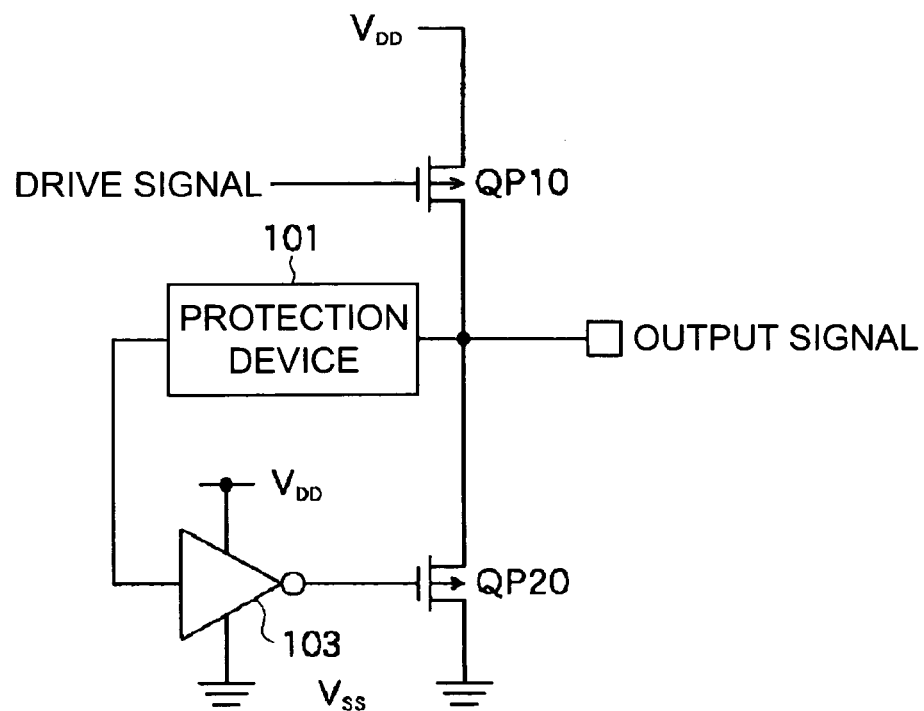
FIG. 6 is a diagram showing a configuration of an output circuit according to a fourth embodiment of this invention.

FIG. 6 is a diagram showing a configuration of an output circuit according to the fourth embodiment of this invention. This output circuit includes a p-channel transistor QP10 to a gate of which a drive signal is supplied, a p-channel transistor QP20 serially connected to the transistor QP10, an output terminal connected to a drain of the transistor QP10 and a source of the transistor QN20 and a protection device 101, and an inverter 103 to which an output signal of the output circuit is supplied through the protection device 101.

The source of the transistor QP10 is connected to the source potential $V_{DD}$, and the source of the transistor QP20 is connected to the source potential $V_{SS}$ (to be set as a grounding potential in this embodiment). An output signal of this output circuit is supplied to an input of the inverter 103 through the protection device 101, and a signal outputted by the inverter 103 is supplied to the gate of the transistor QP20, whereby a self feedback circuit is formed.

When a drive signal is at a high level, the transistor QP10 is in the "off" state, and a potential of the output signal is nearly ($V_{DD}$-$V_{SS}$)/2 due to the operation of self feedback. When the drive signal becomes a low level, the transistor QP10 is in the "on" state, and the potential of the output signal increases to near the source potential $V_{SS}$. Consequently, an amplitude of the output signal becomes a half swing which is approximately half of the source potential ($V_{DD}$-$V_{SS}$). Further, this output circuit is capable of performing high-speed operation by the self feedback operation.

In this embodiment, it is possible to set the high level of the drive signal as the source potential $V_{DD}$ and the low level of the drive signal as the source potential $V_{SS}$. Or, the high level of the drive signal may be set as a potential other than the source potential $V_{SS}$. In that case, the output circuit according to this embodiment will have a function as a level shifter, too. Now, the output signal of the output circuit may be set to receive from an output of the inverter 103.

Now, an embodiment of this invention as applied to a differential signal output circuit will be described below.

Figure 7:
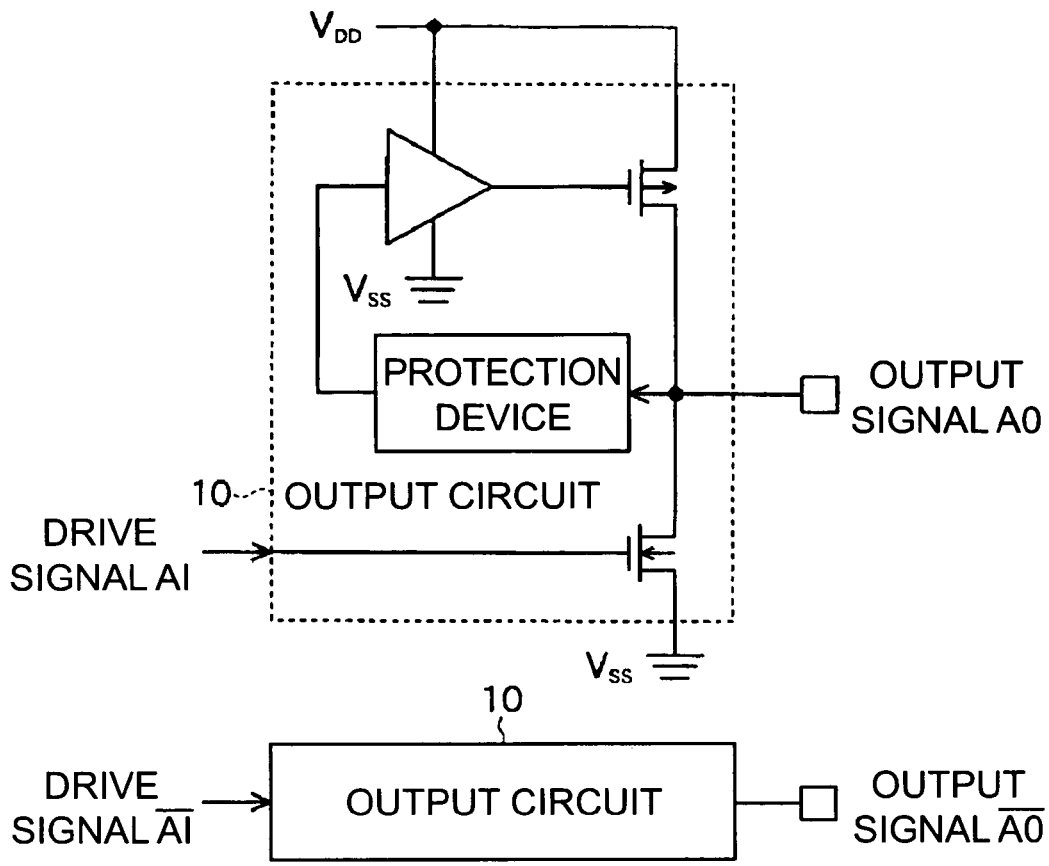
FIG. 7 is a diagram showing a configuration of an output circuit according to a fifth embodiment of this invention.

FIG. 7 is a diagram showing a configuration of an output circuit according to a fifth embodiment of this invention. This differential signal output circuit is configured such that by using two output circuits of a single configuration mentioned above, a differential signal is inputted to output a differential signal.

In a differential signal output circuit shown in FIG. 7, there are included two output circuits according to the first embodiment shown in FIG. 1. Differential drive signals AI and AI bar are inputted to two output circuits 10 which output differential output signals AO and AO bar. By this means, it is possible to output a differential signal of a half swing, which is nearly half of ($V_{DD}$-$V_{SS}$). Now, instead of the output circuit 10, any of the output circuits shown in FIG. 3, FIG. 5, and FIG. 6 according to the second to the fourth embodiments may be used.

Figure 8:
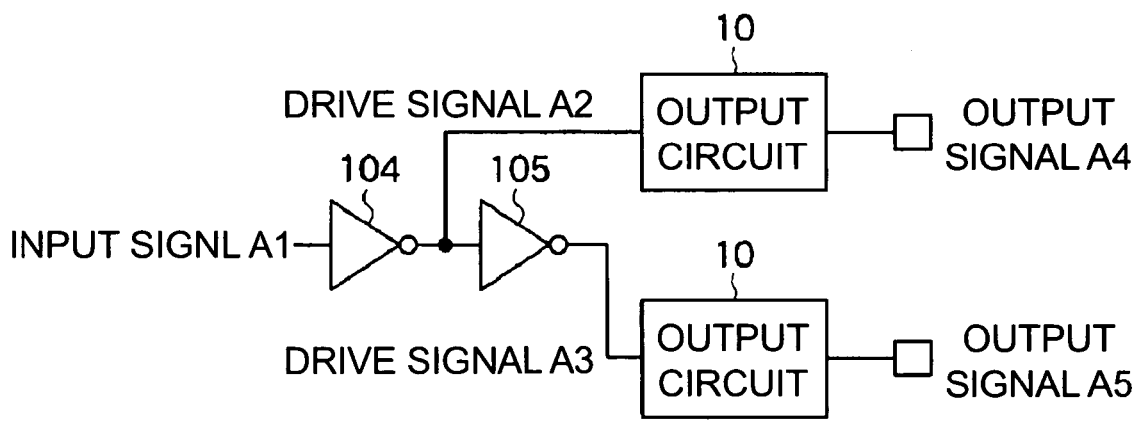
FIG. 8 is a diagram showing a configuration of an output circuit according to a sixth embodiment of this invention.

FIG. 8 is a diagram showing a configuration of an output circuit according to a sixth embodiment of this invention. This differential signal output circuit is configured such that a signal of one system is inputted to output a differential signal.

A differential signal output circuit shown in FIG. 8 includes inverters 104 and 105 as well as two output circuits 10 according to the first embodiment shown in FIG. 1. The inverter 104 inverts an input signal A1 and generates a drive signal A2, while the inverter 105 inverts an input signal A2 and generates a drive signal A3.

Two output circuits 10 are inputted by differential drive signals A2 and A3, outputting differential output signals A4 and A5. By this means, it is possible to output a differential signal of a half swing, which is approximately half of the source voltage ($V_{DD}$-$V_{SS}$). Now, instead of the output circuit 10, any of the output circuits shown in FIG. 3, FIG. 5, and FIG. 6 according to the second to the fourth embodiments may be used.

Figure 9:
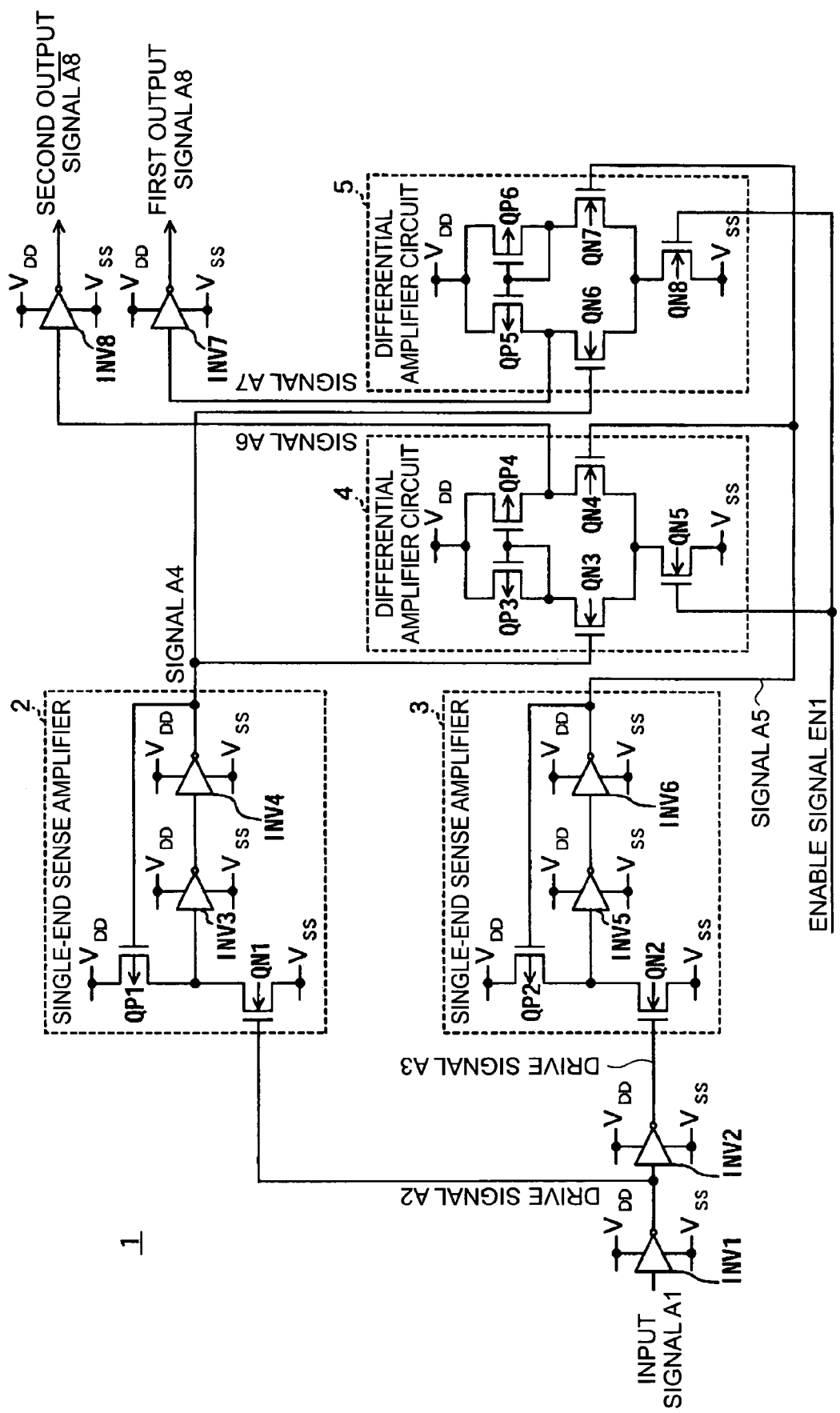
FIG. 9 is a diagram showing a configuration of an output circuit according to a seventh embodiment of this invention.

FIG. 9 is a diagram showing a configuration of an output circuit according to a seventh embodiment of this invention. This differential signal output circuit 1 is a circuit for outputting, based on the input signal A1, a first output signal A8 and a second output signal A8 bar as a pair of differential signals, comprising inverters INV 1, INV2, INV7, INV8, single-end sense amplifiers 2 and 3, and current mirror type differential amplifier circuits 4 and 5. Each of these circuits operates upon receipt of a power supply from the source potential $V_{DD}$ of the high source potential side and the source potential $V_{SS}$ of the low source potential side.

As shown in FIG. 9, to the inverter INV1 is supplied the input signal A1, and the inverter INV1 outputs the drive signal A2 which is the input signal A1 inverted. Now, in this embodiment, this input signal A1 and the drive signal A2 undergo a change between the low level (in this case, the source potential $V_{SS}$ of the low source potential side) and the high level (in this case, the source potential $V_{DD}$ of the high source potential side).

The drive signal A2 is supplied to the inverter INV2, and the inverter INV2 outputs the drive signal A3 which is the drive signal A2 inverted. Now, in this embodiment, the drive signal A3 undergoes a change between the low level and the high level.

The single-end sense amplifier 2 comprises a p-channel transistor QP1, an n-channel transistor QN1, and the inverters INV3 and INV4. This single-end sense amplifier 2 has nearly the same configuration as the output circuit 10 shown in FIG. 1, supplying a signal A4, which is the drive signal A2 inverted and further converted to a prescribed level, to differential amplifier circuits 4 and 5. Now, as a single-end sense amplifier in this embodiment and the following, in addition to the output circuit 10 shown in FIG. 1, any of the output circuits shown in FIG. 3, FIG. 5, and FIG. 6 may be used.

In the single-end sense amplifier 2, a source-drain path of the transistor QP1 and a source-drain path of the transistor QN1 are serially connected to between the source potential $V_{DD}$ of the high source potential side and the source potential $V_{SS}$ of the low source potential side, and to a gate of the transistor QN1, there is supplied the drive signal A2. A node of the transistor QP1 and the transistor QN1 is connected to an input of the inverter INV3, and an output signal of the inverter INV3 is supplied to the inverter INV4.

An output of the inverter INV4 is connected to a gate of the transistor QP1, and the transistor QP1 constitutes a negative feedback group associated with an inverter INV4 output and an inverter INV3 input. Consequently, a level of the signal A4 outputted by the inverter INV4 is a level corresponding to a gain of the above-mentioned feedback group. The signal A44 outputted by the inverter INV4 is feedback inputted to the gate of the transistor QP1, and in addition, it is supplied to the differential amplifier circuits 4 and 5.

A single-end sense amplifier 3 comprises a p-channel transistor QP2, an n-channel transistor QN2, and the inverters INV5 and INV6. This single-end sense amplifier 3 supplies a signal A5, which is the drive signal A3 inverted and further converted to a prescribed level, to the differential amplifier circuits 4 and 5.

The transistors QP2 and QN2, and the inverters INV5 and INV6 in the single-end sense amplifier 3 are connected in the same way as the transistors QP1 and QN1, and the inverters INV3 and INV4 in the single-end sense amplifier 2. As a result, the single-end sense amplifier 3 has the same circuit configuration as the single-end sense amplifier 2.

A differential amplifier circuit 4 comprises p-channel transistors QP3 and QP4 and n-channel transistors QN3–QN5, supplying a signal A6 corresponding to a difference between the signal A4 and the signal A5 to an inverter INV8. Specifically, the signal A6 outputted by the differential amplifier circuit 4 becomes a low level when the signal A4 is at a lower potential than the signal A5 and becomes a high level when the signal A4 is at a higher potential than the signal A5.

To sources of the transistors QP3 and QP4, there is supplied the source potential $V_{DD}$ of the high potential side, and a gate and a drain of the transistor QP3 and a gate of the transistor QP4 are mutually connected. A drain of the transistor QN3 is connected to the drain and the gate of the transistor QP3, and to the gate of the transistor QN3, there is supplied the signal A4. A drain of a transistor QN4 is connected to a drain of a transistor QP4, and to the gate of the transistor QN4, there is supplied the signal A5. A potential of a node between the drain of this transistor QN4 and the drain of the transistor QP4 is supplied, as the signal A6, to an inverter INV8.

To a source of a transistor QN5, there is supplied the source potential $V_{SS}$ of the low potential side, and a drain of the transistor QN5 is connected to sources of the transistors QN3 and QN4.

Also, to a gate of the transistor QN5, there is supplied an enable signal EN1. When the enable signal EN1 is at a high level, the transistor QN5 assumes the "on" state, operating the differential amplifier circuit 4.

A differential amplifier circuit 5 comprises p-channel transistors QP5 and QP6 and n-channel transistors QN6–QN8, supplying a signal A7 corresponding to a difference between the signal A5 and the signal A4 to an inverter INV7. Specifically, the signal A7 outputted by the differential amplifier circuit 5 becomes a high level when the signal A4 is at a lower potential than the signal A5 and becomes a low level when the signal A4 is at a higher potential than the signal A5.

The transistors QP5 and QP6, and the transistors QN6–QN8 in the differential amplifier circuit 5 are connected in the same way as the transistors QP3 and QP4, and the transistors QN3–QN5 in the differential amplifier circuit 4. As a result, the differential amplifier circuit 5 has the same circuit configuration as the differential amplifier circuit 4.

The signal A7 is supplied to the inverter INV7, and the inverter INV7 outputs a signal, which is this signal A7 inverted, as a first output signal A8. The signal A6 is supplied to an inverter INV8, and the inverter INV8 outputs a signal, which is this signal A8 inverted, as a second output signal A8 bar.

Figure 10:
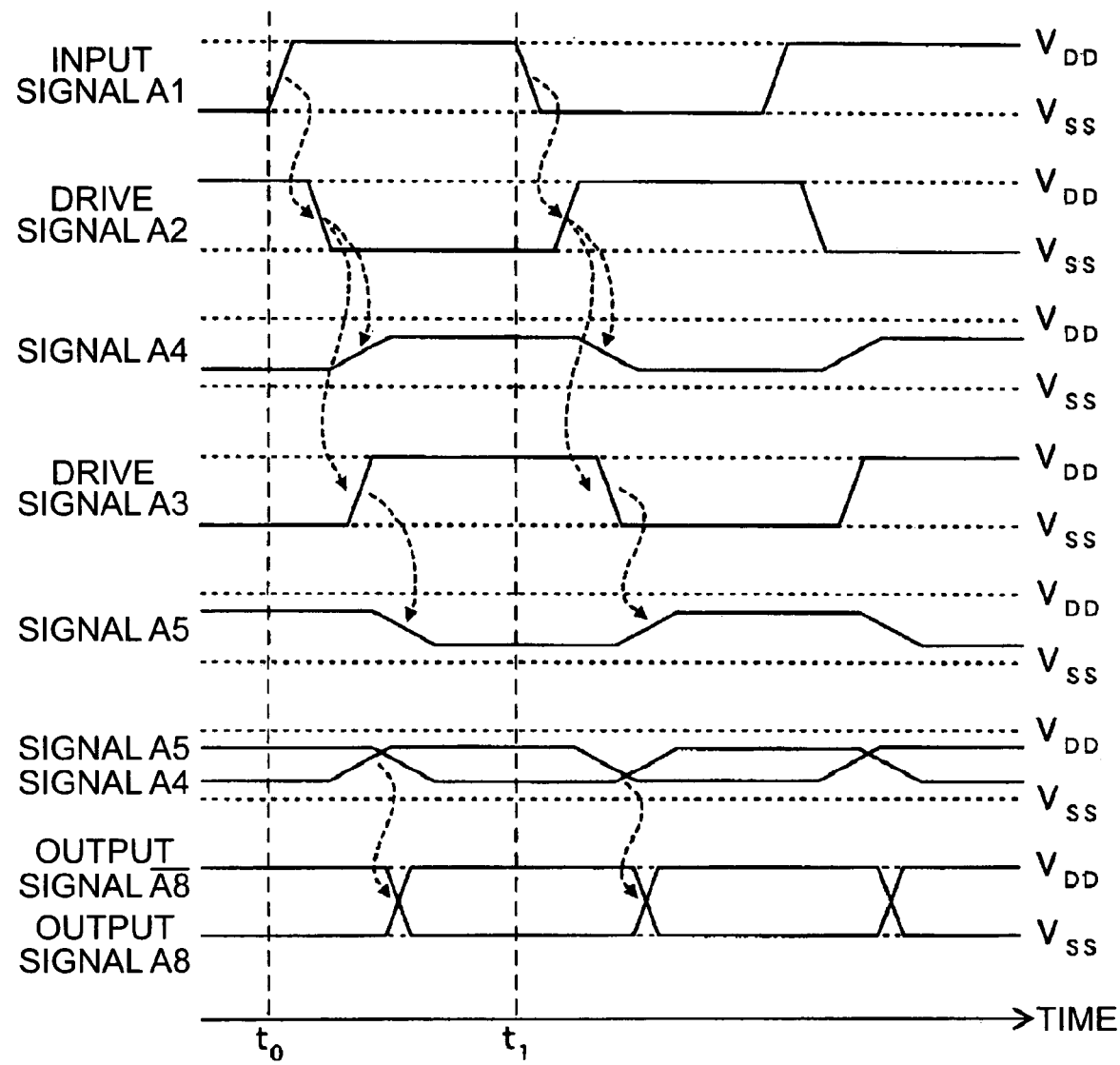
FIG. 10 is a timing chart showing an operation of a differential signal output circuit shown in FIG. 9.

FIG. 10 is a timing chart showing operation of a differential signal output circuit 1.

As FIG. 10 shows, when the input signal A1 changes from low level to high level at time $t_0$, the drive signal A2 outputted by the inverter INV1, after a prescribed delay time, changes from high level to low level. When the drive signal A2 changes from high level to low level, the signal A4 outputted by the single-end sense amplifier 2 changes from a first level, which is at a higher potential than the source potential $V_{SS}$ of the low potential side, to a second level which is at a higher potential than the first level and at a lower potential than the source potential $V_{DD}$ of the high potential side.

On the other hand, when the drive signal A2 changes from high level to low level, the signal A3 outputted by the inverter INV2, after a prescribed delay time, changes from low level to high level. When the drive signal A3 changes from low level to high level, the signal A5 outputted by the single-end sense amplifier 3 changes from the second level to the first level.

At an initial state, a potential of the signal A4 is lower than a potential of the signal A5, and the signal A7 outputted by the differential amplifier circuit 5 is at a high level, while the first output signal A8 outputted by the inverter INV7 is at a low level. Further, the signal A6 outputted by the differential amplifier circuit 4 is at a low level, whereas the second output signal A8 bar outputted by the inverter INV8 is at a high level.

Thereafter, when the input signal A1 changes from a low level to a high level at time $t_0$ as mentioned above, the potential of the signal A4 becomes higher than the potential of the signal A5. By this means, the signal A7 changes from a high level to a low level, and the first output signal A8 changes from a low level to a high level. Further, the signal A6 changes from a low level to a high level, while the second output signal A8 bar changes from a high level to a low level.

Next, when the input signal A1 changes from a high level to a low level at time $t_0$, the drive signal A2, after a prescribed delay time, changes from a low level to a high level. When the drive signal A2 changes from a low level to a high level, the signal A4 outputted by the single-end sense amplifier 2 changes from the second level to the first level.

On the other hand, when the drive signal A2 changes from a low level to a high level, the signal A3 outputted by the inverter INV2, after a prescribed delay time, changes from a high level to a low level. When the drive signal A3 changes from a high level to a low level, the signal A5 outputted by the single-end sense amplifier 3 changes from the first level to the second level.

Consequently, the potential of the signal A4 becomes lower than the potential of the signal A5, and the signal A7 changes from a low level to a high level, while the first output signal A8 changes from a high level to a low level. Further, the signal A6 changes from a high level to a low level, whereas the second output signal A8 bar changes from a low level to a high level.

At this point, since the differential amplifier circuits 4 and 5 output signals A6 and A7 according to the potentials of the signal A6 and the signal A5, skewing will not occur between the signal A6 and the signal A7. Therefore, there will occur no skewing between the first output signal A8 and the second output signal A8 bar.

Now, there is a case of an occurrence of a timing fluctuation by which the signals A2–A5 change due to such factors as a scattering of a manufacturing process, temperature fluctuation, and fluctuation of a source potential (in this case, $V_{DD}$ or $V_{SS}$). However, even in such a case, since the differential amplifier circuits 4 and 5 output the signals A6 and A7 according to a difference of potentials between the signal A4 and the signal A5, even though a timing by which the first output signal A8 and the second output signal A8 bar change may fluctuate before or after that, no skewing will occur between the first output signal A8 and the second output signal A8 bar.

As described above, insofar as the differential signal output circuit according to this invention is concerned, there is no requirement of a capacitor as required in the conventional differential signal output circuit 91 (refer to FIG. 19), hence, it is possible to prevent a yield drop and the like.

Figure 11:
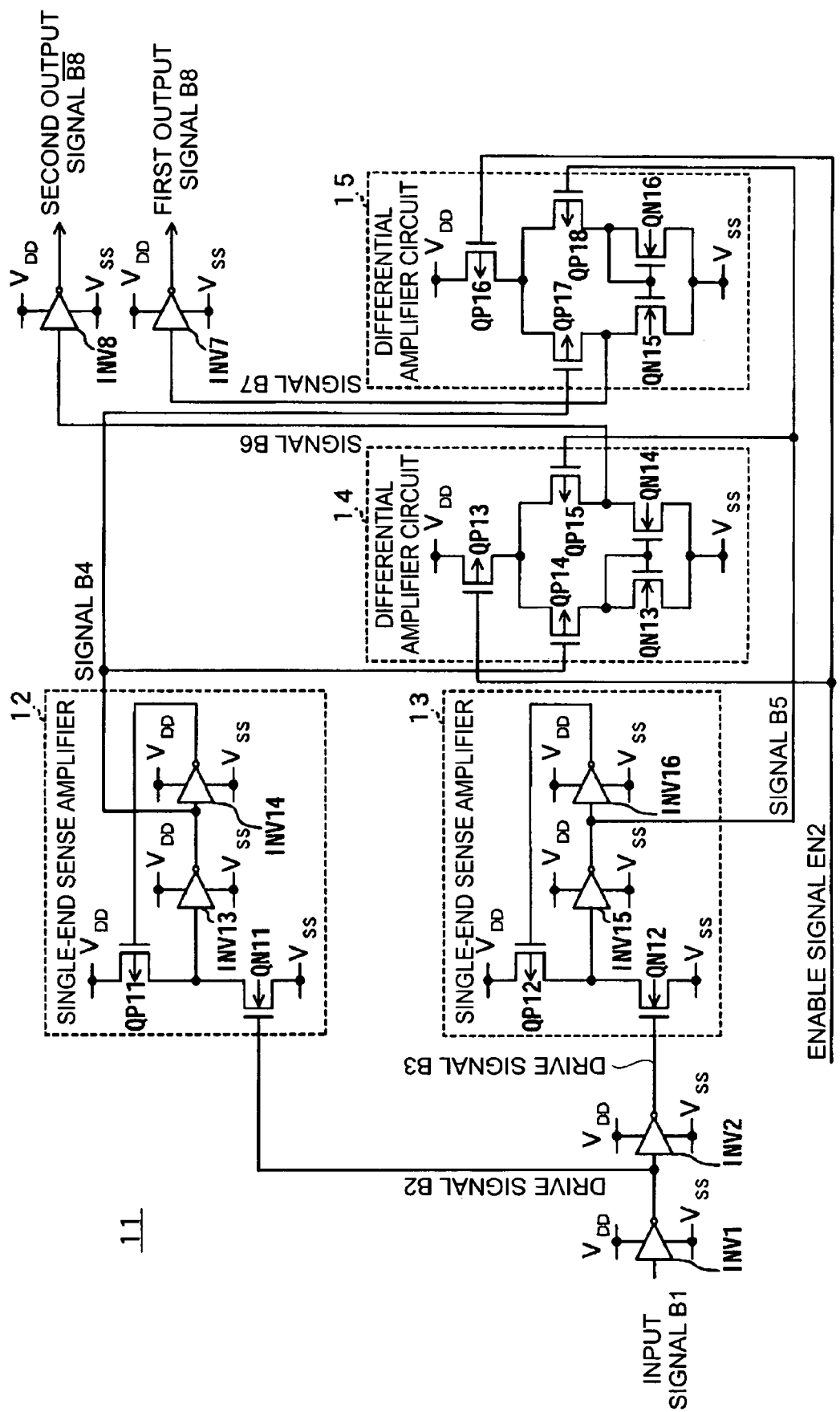
FIG. 11 is a diagram showing a configuration of an output circuit according to an eighth embodiment of this invention.

Next, an eighth embodiment of this invention will be described. FIG. 11 is a diagram showing an output circuit according to the eighth embodiment of this invention. This differential signal output circuit 11 is a circuit for outputting, based on an input signal B1, a first output signal B8 and a second output signal B8 bar as a pair of differential signals, comprising inverters INV1, INV2, INV7, INV8, single-end sense amplifiers 12 and 13, and current mirror type differential amplifier circuits 14 and 15. Each of these circuits operates upon receipt of power supply from the source potential $V_{DD}$ of the high source potential side and the source potential $V_{SS}$ of the low source potential side.

As compared to the differential signal output circuit 1 (refer to FIG. 9) described above, the single-end sense amplifier 2 in the differential signal output circuit 1 outputs the drive signal A2 and the signal A4 inverted, and the single-end sense amplifier 3 outputs the drive signal A3 and the signal A5 inverted. On the other hand, the single-end sense amplifier 12 in the differential signal output circuit 11 outputs the drive signal B2 and the signal B4 of the same phase, and the single-end sense amplifier 13 outputs the drive signal B3 and the signal B5 of the same phase. Further, the differential amplifier circuits 14 and 15 are of an inverted circuit configuration to the differential amplifier circuits 4 and 5 in the differential signal output circuit 1 as well as the source potentials $V_{DD}$ and $V_{SS}$.

Figure 19:
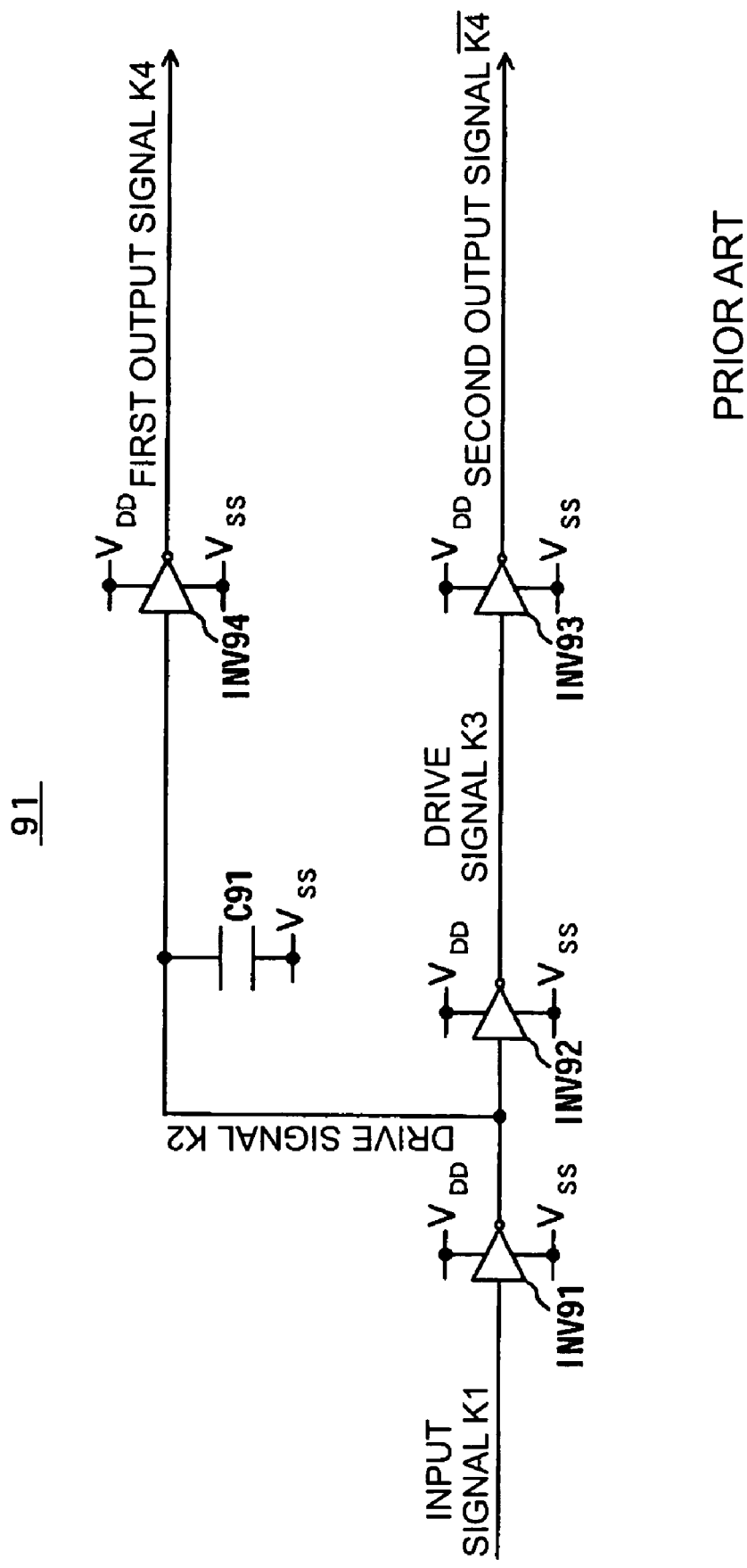
FIG. 19 is a diagram showing another configuration example of a conventional differential signal output circuit.

The differential signal output circuit 11 is, like the differential signal output circuit 1, able to output a first output signal B8 and a second output signal B bar having no skewing, also being capable of preventing a yield drop and the like because there is no requirement of a capacitor which is required in the conventional interface signal output circuit 91 (refer to FIG. 19).

Figure 12:
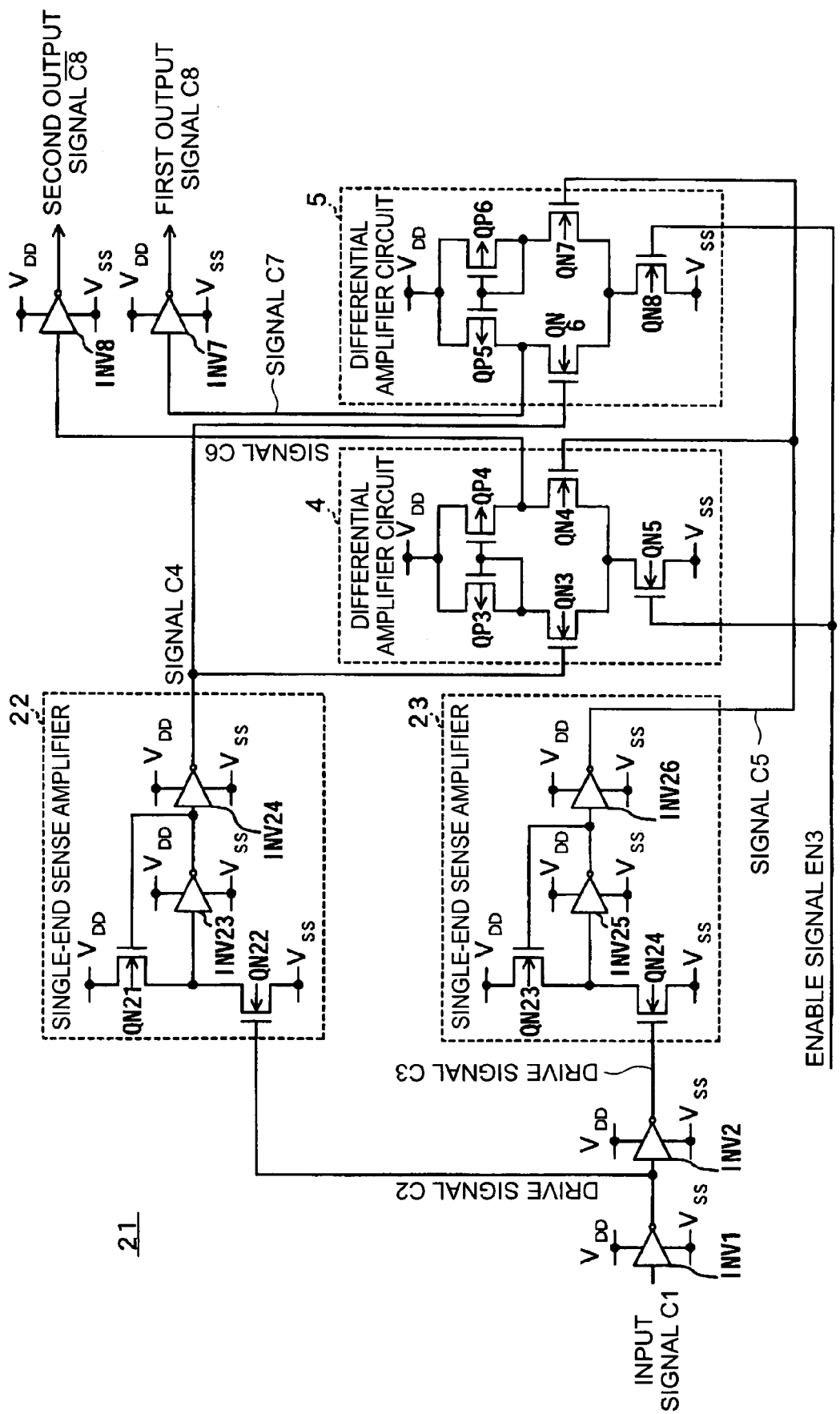
FIG. 12 is a diagram showing a configuration of an output circuit according to a ninth embodiment of this invention.

Next, a ninth embodiment of this invention will be described. FIG. 12 is a diagram showing an output circuit according to the ninth embodiment of this invention. This differential signal output circuit 21 is a circuit for outputting, based on an input signal C1, a first output signal C8 and a second output signal C8 bar as a pair of differential signals, comprising inverters INV 1, INV2, INV7, INV8, single-end sense amplifiers 22 and 23, and current mirror type differential amplifier circuits 4 and 5. Each of these circuits operates upon receipt of power supply from the source potential $V_{DD}$ of the high source potential side and the source potential $V_{SS}$ of the low source potential side.

As compared to the differential signal output circuit 11 (refer to FIG. 11) described above, the differential signal output circuit 21 has different configurations of the single-end sense amplifier 22 and the single-end sense amplifier 23.

The single-end sense amplifier 22 comprises n-channel transistors QN21 and QN21 and inverters INV23 and INV24, supplying a signal, which is a drive signal C2 inverted, to the differential amplifier circuits 4 and 5.

Source-drain paths of the transistors QN21 and QN22 are connected in series to between the source potential $V_{DD}$ of the high source potential side and the source potential $V_{SS}$ of the low source potential side, and the drive signal C2 is supplied to a gate of the transistor Q22. A node of the transistor QN21 and the transistor QN22 is connected to an input of the inverter INV23.

An output of the inverter INV 23 is connected to a gate of the transistor QN21, and the transistor QN21 constitutes a negative feedback group associated with an output and an input of the inverter INV23. Consequently, a level of a signal outputted by the inverter INV23 becomes a level corresponding to a gain of the above-mentioned feedback group. An output signal of the inverter INV23 is also supplied to the inverter INV24, and the inverter INV24 supplies the signal C4, which is an output signal of the inverter INV23 inverted, to the differential amplifier circuits 4 and 5.

The single-end sense amplifier 23 comprises p-channel transistors QN23 and QN24 and inverters INV25 and INV26, supplying a signal C5, which is a drive signal C3 inverted, to the differential amplifier circuits 4 and 5. The transistors QN23 and QN24 as well as the inverters INV25 and INV26 in the single-end sense amplifier 23 are connected in the same way as the transistors QN21 and QN22 as well as the inverters INV23 and INV24 in the single-end sense amplifier 22. As a result, the single-end sense amplifier 23 has the same circuit configuration as the single-end sense amplifier 22.

The differential signal output circuit 21 is able to output a first output signal B8 and a second output signal B8 bar having no skewing in the same way as the differential signal output circuit 11. Further, since there is no requirement of a capacitor as required in the conventional differential signal output circuit 91 (refer to FIG. 19); it is possible to prevent a yield drop and the like.

Figure 13:
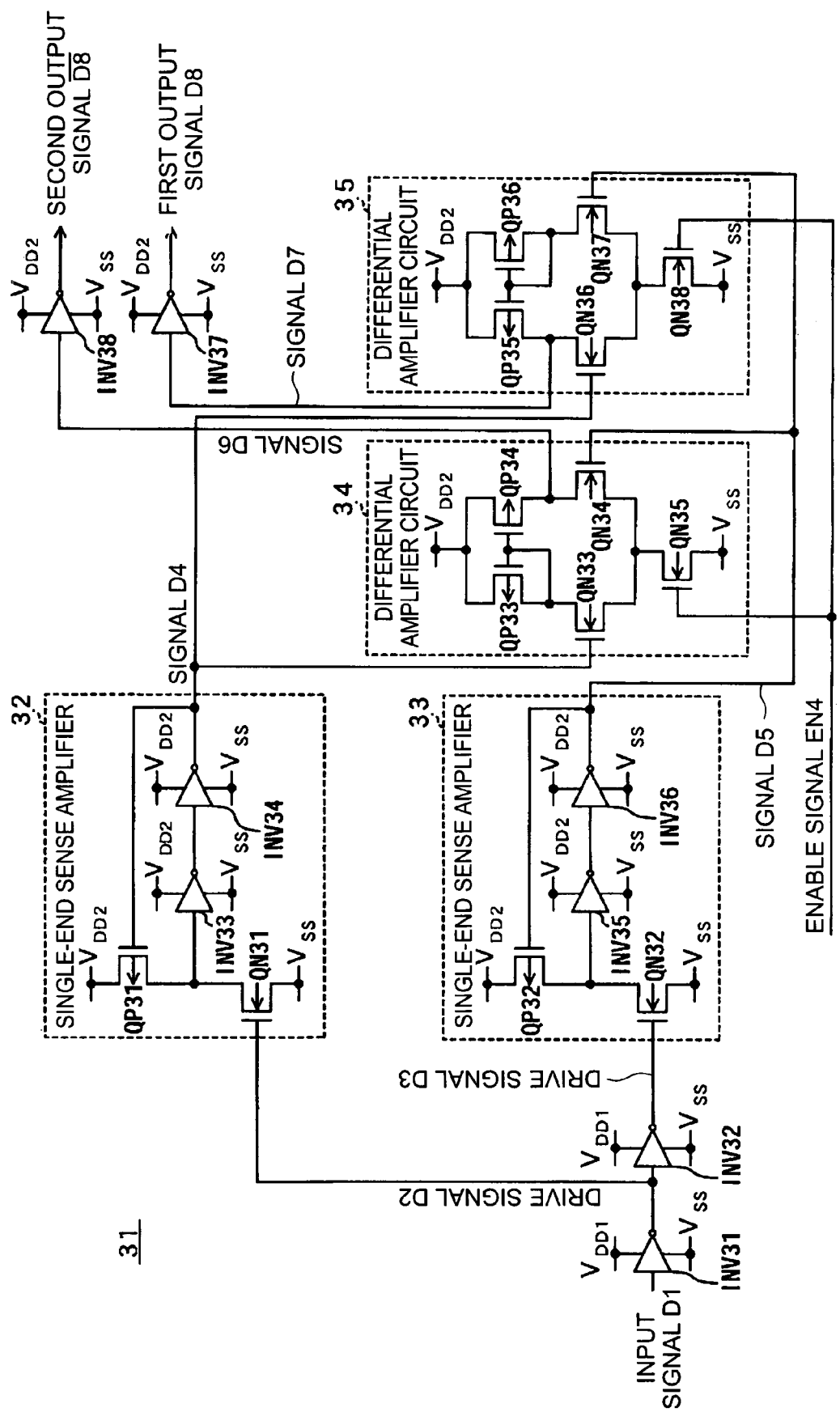
FIG. 13 is a diagram showing a configuration of an output circuit according to a tenth embodiment of this invention.

Next, a tenth embodiment of this invention will be described. FIG. 13 is a diagram showing an output circuit according to the tenth embodiment of this invention. This differential signal output circuit 31 is a circuit for outputting, based on an input signal D1, a first output signal D8 and a second output signal D8 bar as a pair of differential signals, comprising inverters INV31, INV32, INV37, and INV38, single-end sense amplifiers 32 and 33, and current mirror type differential amplifier circuits 34 and 35.

The single-end sense amplifier 32 comprises a p-channel transistor QP31, an n-channel transistor QN31, and inverters INV33 and INV34, having the same circuit configuration as the single-end sense amplifier 2 in the above-mentioned differential signal output circuit 1 (refer to FIG. 9). Likewise, the single-end sense amplifier 33 comprises a p-channel transistor QP32, an n-channel transistor QN32, and inverters INV35 and INV36, having the same circuit configuration as the single-end sense amplifier 3 in the above-mentioned differential signal output circuit 1 (refer to FIG. 9).

Further, the differential amplifier circuit 34 comprises p-channel transistors QP33 and QP34, and n-channel transistors QN33–QN35, having the same circuit configuration as the differential amplifier circuit 4 in the above-mentioned signal output circuit 1 (refer to FIG. 9). Likewise, the differential amplifier circuit 35 comprises a p-channel transistors QP35 and QP36, and n-channel transistors QN36–QN38, having the same circuit configuration as the differential amplifier circuit 5 in the above-mentioned signal output circuit 1 (refer to FIG. 9).

In the differential signal output circuit 31, as compared to the above-mentioned signal output circuit 1 (refer to FIG. 9), power is supplied by a source potential $V_{DD1}$ of the high source potential side and the source potential $V_{SS}$ of the low source potential side to the inverters INV31 and INV32, whereas it is different in that power is supplied by a source potential $V_{DD2}$ of the high source potential side and the source potential $V_{SS}$ of the low source potential side to the single-end sense amplifiers 32 and 33, the differential amplifier circuits 34, and 35, and the inverters INV37 and INV38.

At this time, if we assume $$V_{DD2} > V_{DD1} \qquad (1)$$

then the differential signal output circuit 31 will have a function as a booster circuit. For example, assume that a source potential $V_{SS}$ is 0V, a source potential $V_{DD1}$ is 1.8V, and a source potential $V_{DD2}$ is 2.5V, then it becomes possible, based on an input signal D1 of a 1.8V level, to output a first output signal D8 and a second output signal D8 bar of a 2.5V level.

Further, if we assume $$V_{DD1} > V_{DD2} \qquad (2)$$

then the differential signal output circuit 31 will have a function as a step-down circuit. For example, assume a source potential $V_{SS}$ of 0V, a source potential $V_{DD2}$ of 1.8V, and a source potential $V_{DD1}$ of 2.5V, then it becomes possible, based on an input signal D1 of a 2.5V level, to output a first output signal D8 and a second output signal D8 bar of a 1.8V level.

Figure 14:
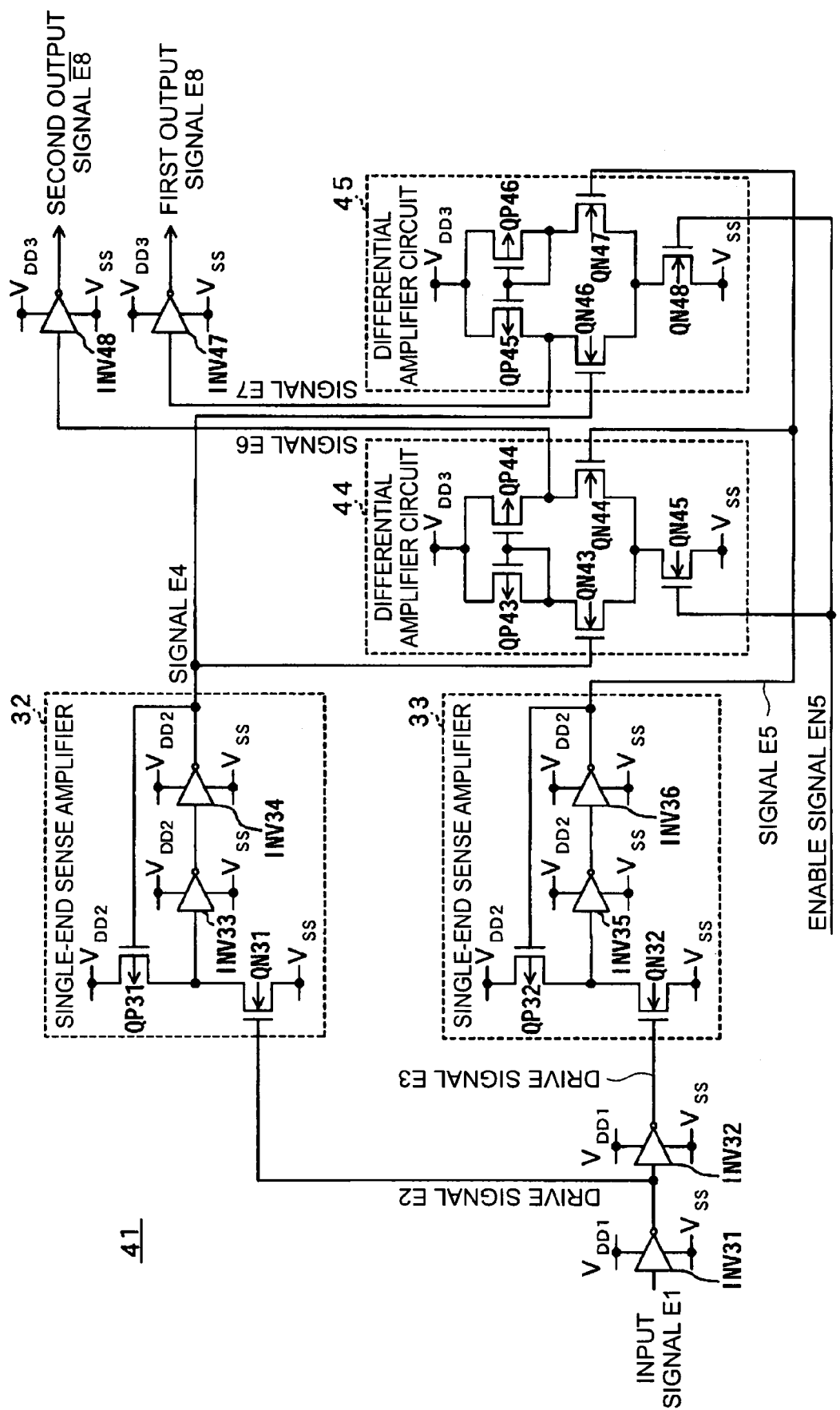
FIG. 14 is a diagram showing a configuration of an output circuit according to a eleventh embodiment of this invention.

Next, an eleventh embodiment of this invention will be described. FIG. 14 is a diagram showing an output circuit according to the eleventh embodiment of this invention. This differential signal output circuit 41 is a circuit for outputting, based on an input signal E1, a first output signal E8 and a second output signal E8 bar as a pair of differential signals, comprising inverters INV31, INV32, INV47, and INV48, single-end sense amplifiers 32 and 33, and current mirror type differential amplifier circuits 44 and 45.

The differential amplifier circuit 44 comprises p-channel transistors QP43 and QP44, and n-channel transistors QN43–QN45, having the same circuit configuration as the differential amplifier circuit 4 in the above-mentioned differential signal output circuit 1 (refer to FIG. 9). Likewise, the differential amplifier circuit 45 comprises p-channel transistors QP45 and QP46, and n-channel transistor QN46–48, having the same circuit configuration as the differential amplifier circuit 5 in the above-mentioned differential signal output circuit 1 (refer to FIG. 9).

In the differential signal output circuit 41, as compared to the above-mentioned signal output circuit 1 (refer to FIG. 9), power is supplied by the source potential $V_{DD1}$ of the high source potential side and the source potential $V_{SS}$ of the low source potential side to the inverters INV31 and INV32, and power is supplied by the source potential $V_{DD2}$ of the high source potential side and the source potential $V_{SS}$ of the low source potential side to the single-end sense amplifiers 32 and 33, whereas it is different in that power is supplied by a source potential $V_{DD3}$ of the high source potential side and the source potential $V_{SS}$ of the low source potential side to the differential amplifier circuits 44 and 45 as well as the inverters INV47 and INV48.

At this time if we assume $$V_{DD3} > V_{DD2} > V_{DD1} \qquad (3)$$

then the differential signal output circuit 41 will have a function as a booster circuit. For example, as compared to the differential signal output circuit 1 (refer to FIG. 9) described above, this differential signal output circuit 41 is particularly effective in a case of a large potential difference between an input signal E1, and a first output signal E8 and a second output signal E8 bar.

For example, in the differential signal output circuit 31 (refer to FIG. 13) described above for outputting, based on the input signal D1 of the 1.8V level, the first output signal D8 and the second output signal D8 bar of a 5V level, it is necessary to supply 0V as the source potential $V_{SS}$ of the low potential side, 1.8V as the source potential $V_{DD1}$ of the high potential side, and 5V as the source potential $V_{DD2}$ of the low potential side. However, supplying such source potentials would cause the single-end sense amplifiers 22 and 23 operating on the 5V source potential to receive the drive signals D2 and D3 of the 1.8 level, thus making it difficult to perform a desired operation.

On the other hand, if it is adapted in the differential signal output circuit 41 such that 0V as the source potential $V_{SS}$ of the low potential side, 1.8V as the source potential $V_{DD1}$ of the high potential side, 3.3V as the source potential $V_{DD2}$, and 5V as the source potential $V_{DD3}$ of the low potential side are supplied, then it would become easy to output, based on the input signal E1 of the 1.8V level, the first output signal E8 and the second output signal E8 bar of the 5V level.

Further, if we assume $$V_{DD1} > V_{DD2} > V_{DD3} \qquad (4)$$

then the differential signal output circuit 41 will have a function as a step-down circuit. As compared to the differential signal output circuit 31 (refer to FIG. 13) described above, this differential signal output circuit 41 is particularly effective in a case of a large potential difference between the input signal E1, and the first output signal E8 and the second output signal E8 bar.

For example, in the differential signal output circuit 31 (refer to FIG. 13) described above for outputting, based on the input signal D1 of the 5V level, the first output signal D8 and the second output signal D8 bar of a 1.8V level, it is necessary to supply 0V as the source potential $V_{SS}$ of the low potential side, 5V as the source potential $V_{DD1}$ of the high potential side, and 1.8V as the source potential $V_{DD2}$ of the high potential side. However, supplying such source potentials would cause the single-end sense amplifiers 32 and 33 operating on the 1.8V source potential to receive the drive signals D2 and D3 of the 5 level, thus making it difficult to perform a desired operation.

On the other hand, if it is adapted in the differential signal output circuit 41 such that 0V as the source potential $V_{SS}$ of the low potential side, 5V as the source potential $V_{DD1}$, 3.3V as the source potential $V_{DD2}$, and 1.8V as the source potential $V_{DD3}$ are supplied, then it would become easy to output, based on the input signal E1 of the 5V level, the first output signal E8 and the second output signal E8 bar.

Figure 15:
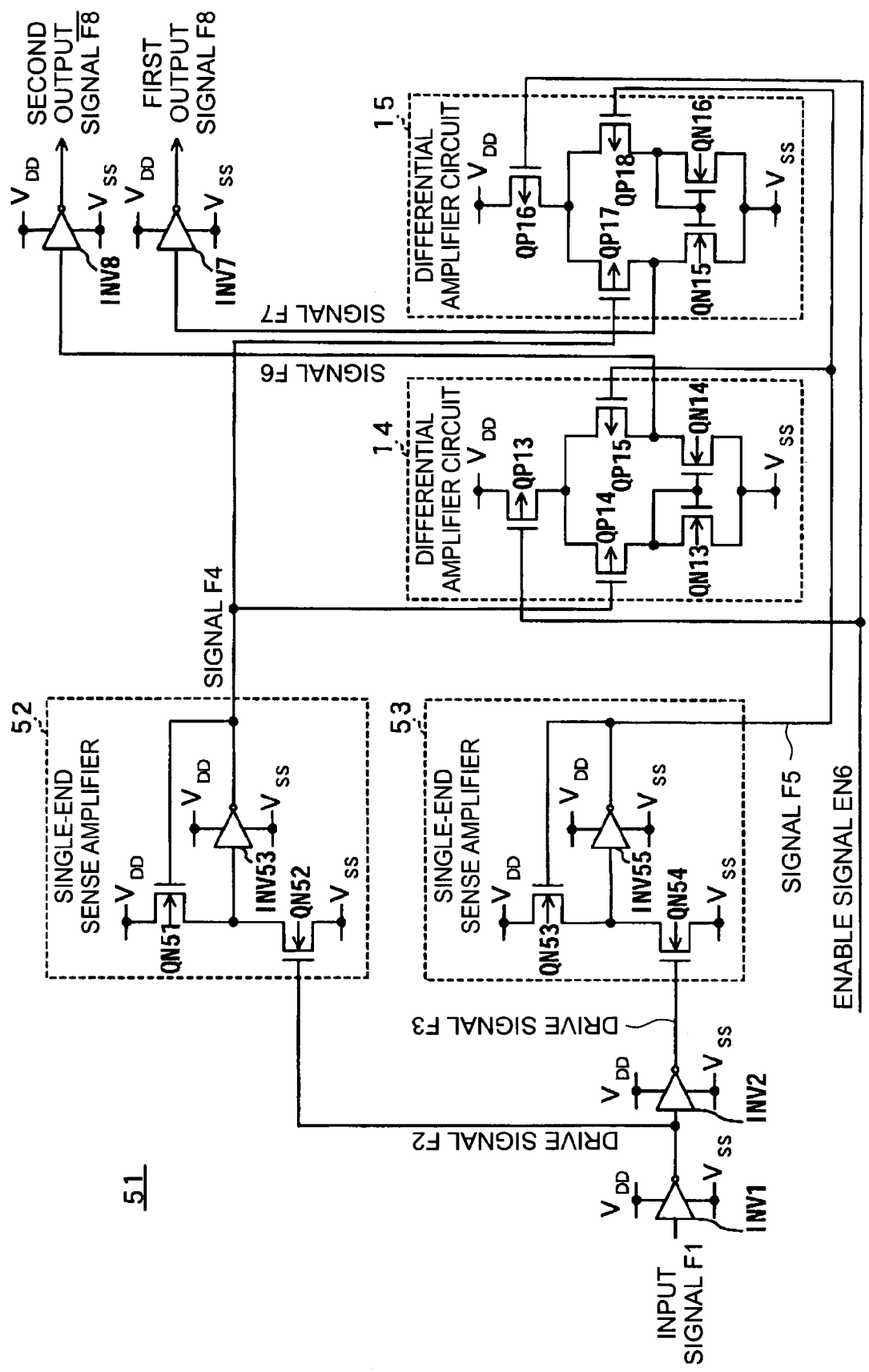
FIG. 15 is a diagram showing a configuration of an output circuit according to a twelfth embodiment of this invention.

Next, a twelfth embodiment of this invention will be described. FIG. 15 is a diagram showing an output circuit according to the twelfth embodiment of this invention. This differential signal output circuit 51 is a circuit for outputting, based on the input signal E1, a first output signal F8 and a second output signal F8 bar as a pair of differential signals, comprising inverters INV1, INV2, INV7, and INV8, single-end sense amplifiers 52 and 53, and current mirror type differential amplifier circuits 14 and 15. Each of these circuits receives power supplied by the source potential $V_{DD}$ of the high potential side and the source potential $V_{SS}$ of the low potential side and operates.

As compared to the above-mentioned differential amplifier circuit 11 (refer to FIG. 11), the signal output circuit 51 has different configurations of the single-end sense amplifiers 52 and 53. The single-end sense amplifier 52 comprises n-channel transistors QN51 and QN52 and an inverter INV53, supplying a signal F4, which is a drive signal F2 converted to a prescribed potential level, to differential amplifier circuits 14 and 15.

Source-drain paths of the transistors QN51 and QN52 are serially connected to between the source potential $V_{DD}$ of the high source potential side and the source potential $V_{SS}$ of the low source potential side, and to a gate of the transistor QN51, there is supplied the drive signal F2. A node of the transistor QN51 and the transistor QN52 is connected to an input of the inverter INV53.

An output of the inverter INV53 is connected to the gate of the transistor QN51, and the transistor QN51 constitutes a negative feedback group associated with an input and an output of the inverter INV53. Consequently, a level of the signal A4 outputted by the inverter INV53 is a level corresponding to a gain of the above-mentioned feedback group.

A single-end sense amplifier 53 comprises n-channel transistors QN53 and QN54, and an inverters INV55, supplying a drive signal F5, which is a drive signal F3 converted to a prescribed level, to the differential amplifier circuits 14 and 15.

The transistors QN53 and QN54, and the inverter INV55 in the single-end sense amplifier 53 are connected in the same way as the transistors QN51 and QN52 as well as the inverter INV53 in the single-end sense amplifier 52. As a result, the single-end sense amplifier 53 has the same circuit configuration as the single-end sense amplifier 52.

In this manner, according to the differential signal output circuit 51, it is possible to realize an equivalent function as the differential signal output circuit 11 with fewer elements than the differential signal output circuit 11.

Figure 16:
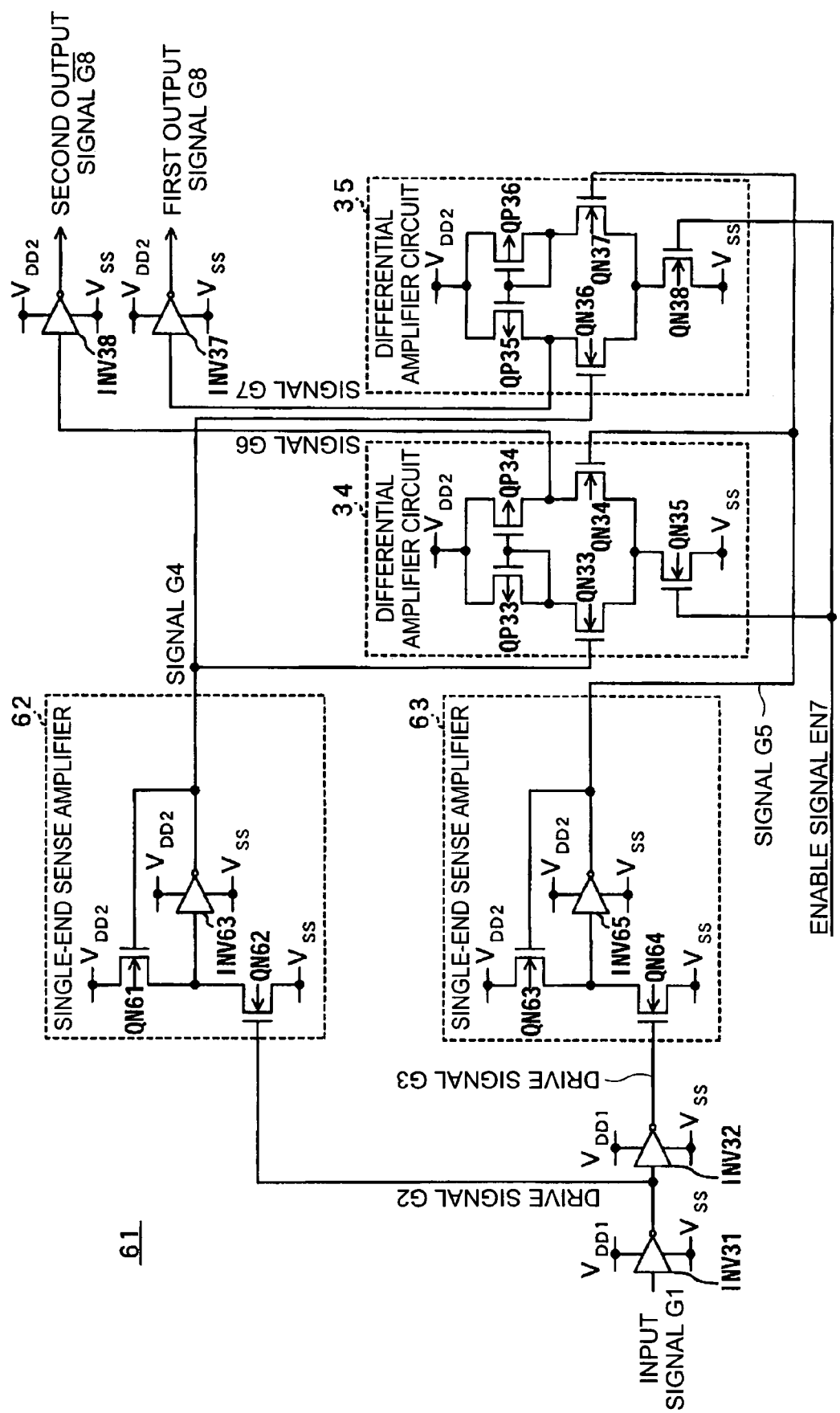
FIG. 16 is a diagram showing a configuration of an output circuit according to a thirteenth embodiment of this invention.

Next, a thirteenth embodiment of this invention will be described. FIG. 16 is a diagram showing an output circuit according to the thirteenth embodiment of this invention. This differential signal output circuit 61 is a circuit for outputting, based on an input signal G1, a first output signal G8 and a second output signal G8 bar as a pair of differential signals, comprising inverters INV31, INV32, INV37, and INV38, single-end sense amplifiers 62 and 63, and the current mirror type differential amplifier circuits 34 and 35.

As compared to the above-mentioned differential amplifier circuit 31 (refer to FIG. 13), the signal output circuit 61 has different configurations of the single-end sense amplifiers 62 and 63. The single-end sense amplifier 62 comprises n-channel transistors QN61 and QN62 as well as an inverter INV63, supplying a signal G4, which is a drive signal G2 converted to a prescribed potential level, to the differential amplifier circuits 34 and 35.

Source-drain paths of the transistors QN61 and QN62 are serially connected to between the source potential $V_{DD2}$ of the high source potential side and the source potential $V_{SS}$ of the low source potential side, and to a gate of the transistor QN62 there is supplied the drive signal G2. A node of the transistor QN61 and the transistor QN62 is connected to an input of the inverter INV63.

An output of the inverter INV63 is connected to the gate of the transistor QN61, and the transistor QN61 constitutes a negative feedback group associated with an output and an input of the inverter INV63. Consequently, a level of the signal G4 outputted by the inverter INV63 is a level corresponding to a gain of the above-mentioned feedback group.

A single-end sense amplifier 63 comprises n-channel transistors QN63 and QN64, and an inverters INV55, supplying a drive signal G5, which is a drive signal G3 converted to a prescribed level, to the differential amplifier circuits 34 and 35.

The transistors QN63 and QN64, and the inverter INV65 in the single-end sense amplifier 63 are connected in the same way as the transistors QN61 and QN62 as well as the inverter INV53 in the single-end sense amplifier 62. As a result, the single-end sense amplifier 63 has the same circuit configuration as the single-end sense amplifier 62.

In this manner, according to the differential signal output circuit 61, it is possible to realize an equivalent function as the differential signal output circuit 31 with fewer elements than the differential signal output circuit 31.

Next, a fourteenth embodiment of this invention will be described.

Figure 17:
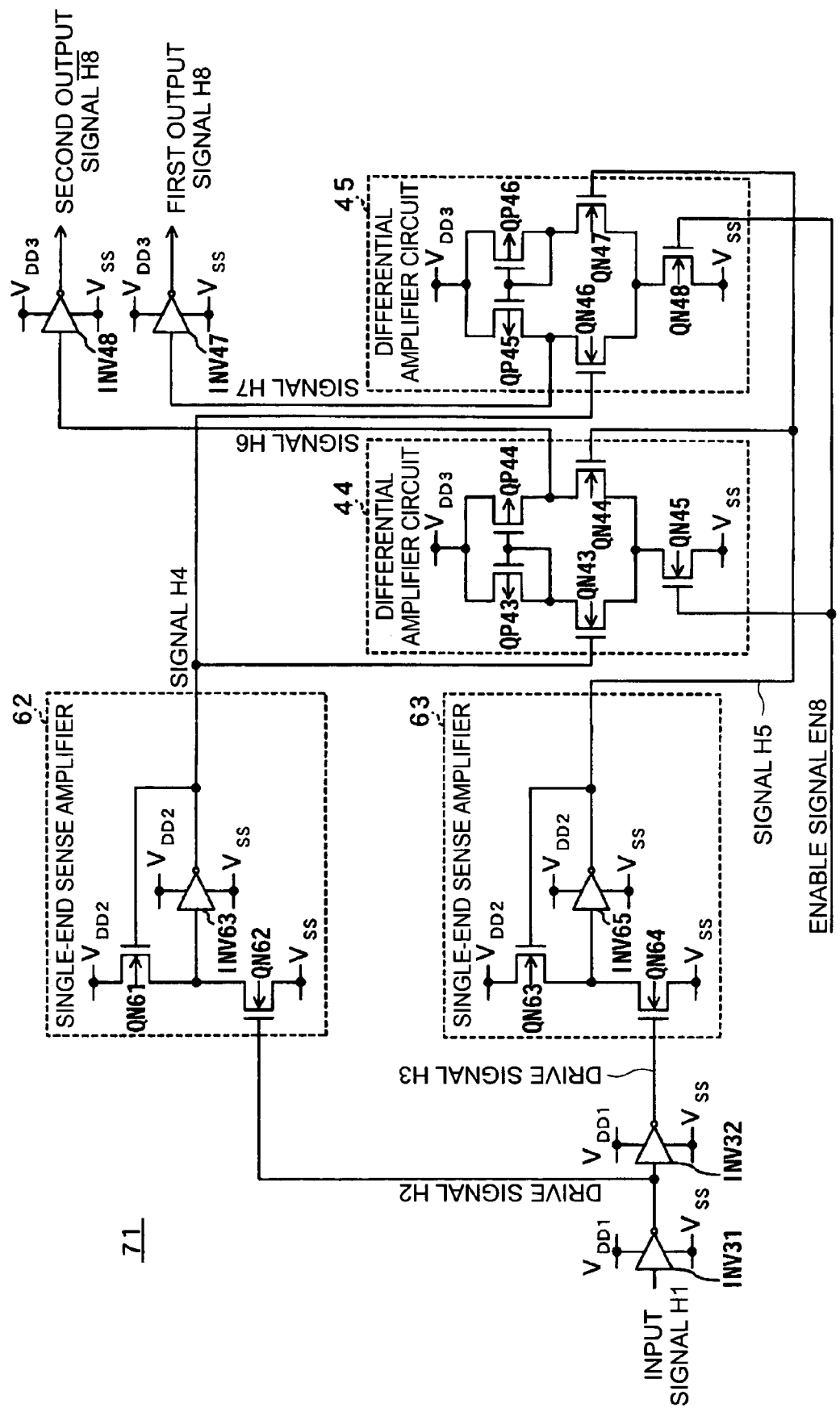
FIG. 17 is a diagram showing a configuration of an output circuit according to a fourteenth embodiment of this invention.
Figure 18:
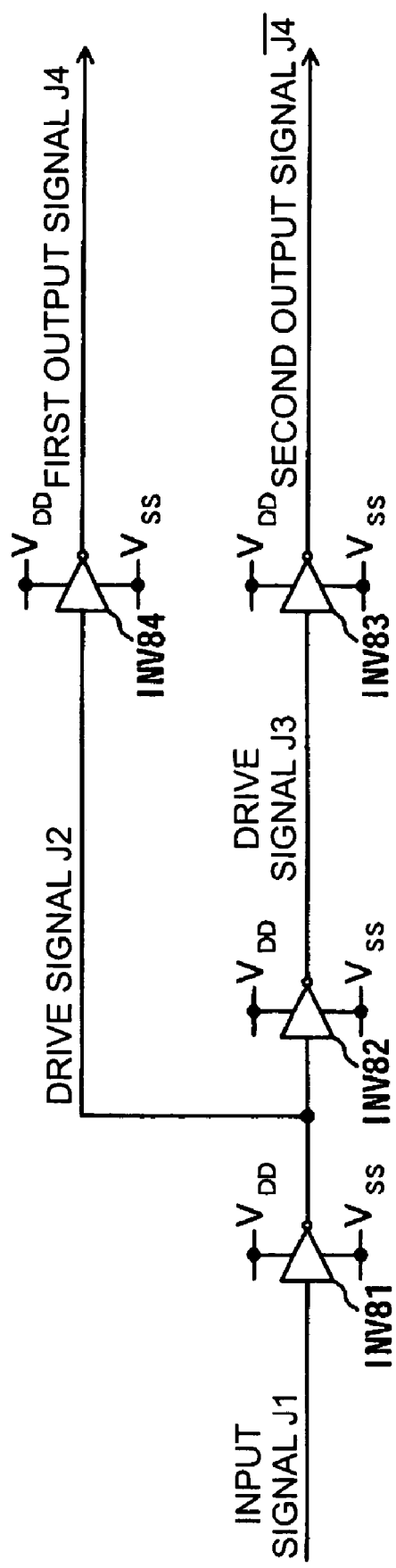
FIG. 18 is a diagram showing a configuration example of a conventional differential signal output circuit.

FIG. 17 is a diagram showing an output circuit according to the fourteenth embodiment of this invention. This differential signal output circuit 71 is a circuit for outputting, based on an input signal HI, a first output signal H8 and a second output signal H8 bar as a pair of differential signals, comprising inverters INV31, INV32, INV47, and INV48, the single-end sense amplifiers 62 and 63, and the current mirror type differential amplifier circuits 44 and 45.

The signal output circuit 51 is that which makes use of the single-end sense amplifiers 32 and 33 in the above-mentioned differential amplifier circuit 61 (refer to FIG. 16) instead of the single-end sense amplifiers 62 and 63 in the above-mentioned differential amplifier circuit 41 (refer to FIG. 14).

According to a differential output circuit 71, it is possible to realize an equivalent function as the differential signal output circuit 41 with fewer elements than the differential signal output circuit 41.

INDUSTRIAL APPLICABILITY

Among other possibilities, this invention may be utilized in an output circuit for outputting a signal to an external circuit and a semiconductor integrated circuit having such an output circuit built-in.

What is claimed is:

1. An output circuit for outputting, based on a first and a second drive signal and a first and a second output signal, comprising:

first and second signal level converting circuits respectively converting the first and the second drive signal into a signal of a prescribed level and outputting the signal;

a first differential circuit outputting a signal corresponding to a difference between the signal outputted by the first signal level converting circuit and the signal outputted by the second signal level converting circuit;

a second differential circuit outputting a signal corresponding to a difference between the signal outputted by the second signal level converting circuit and the signal outputted by the first signal level converting circuit;

a first signal generating circuit generating the first output signal based on the signal outputted by the first differential circuit;

a second signal generating circuit generating the second output signal based on the signal outputted by the second differential circuit;

a first inverting circuit inverting an input signal and outputting the first drive signal; and a second inverting circuit inverting the first drive signal and outputting the second drive signal, wherein the first and second inverting circuits operate upon receipt of a power supply from a first and a second source potential and the first and second signal level converting circuits, the first and second differential circuits, and the first and second output signal generating circuits operate upon receipt of a power supply from the first and a third source potential.

2. The output circuit according to claim 1, wherein:

at least one of the first and the second signal level converting circuits includes a single-end sense amplifier.

3. The output circuit according to claim 1, wherein:

at least one of the first and the second differential circuits includes a current mirror type differential multiplier circuit.

4. The output circuit according to claim 1, wherein:

at least one of the first and the second output signal generating circuits includes an inverter.

5. The output circuit according to claim 1, wherein the first and the second differential circuits and the first and the second output signal generating circuits operate upon receipt of a power supply from the first and a fourth source potential.

6. The output circuit according to claim 5, wherein:

the third source potential is at a higher potential than the second source potential; and the fourth source potential is at a higher potential than the third source potential.

7. The output circuit according to claim 5, wherein:

the third source potential is at a lower potential than the second source potential; and the fourth source potential is at a lower potential than the third source potential.

8. A semiconductor integrated circuit incorporating an output circuit according to claim 1.

* * * * *